(12) United States Patent
Nakai et al.

(10) Patent No.: US 7,626,317 B2
(45) Date of Patent: Dec. 1, 2009

(54) PIEZOELECTRIC OSCILLATION ELEMENT AND PIEZOELECTRIC OSCILLATION COMPONENT USING THE SAME

(75) Inventors: Yasuhiro Nakai, Kirishima (JP); Kenji Yamakawa, Kirishima (JP)

(73) Assignee: Kyocera Corporation, Kyoto (JP)

( * ) Notice: Subject to any disclaimer, the term of this patent is extended or adjusted under 35 U.S.C. 154(b) by 362 days.

(21) Appl. No.: 11/814,797

(22) PCT Filed: Jan. 25, 2006

(86) PCT No.: PCT/JP2006/301131
§ 371 (c)(1),
(2), (4) Date: Jul. 25, 2007

(87) PCT Pub. No.: WO2006/080341
PCT Pub. Date: Aug. 3, 2006

(65) Prior Publication Data
US 2009/0200900 A1 Aug. 13, 2009

(30) Foreign Application Priority Data
Jan. 28, 2005 (JP) .............................. 2005-020887
Feb. 25, 2005 (JP) .............................. 2005-051974

(51) Int. Cl.
*H01L 41/08* (2006.01)
(52) U.S. Cl. ...................................... 310/365; 310/321
(58) Field of Classification Search ......... 310/363–368, 310/311, 320–324, 348; *H01L 41/08, 41/047*
See application file for complete search history.

(56) References Cited

U.S. PATENT DOCUMENTS 6,274,964 B1 * 8/2001 Yoshida et al. .............. 310/321
6,548,941 B2 * 4/2003 Sawada et al. .............. 310/363

FOREIGN PATENT DOCUMENTS

| JP | 03-052312 | 3/1991 |
| JP | 05-218784 | 8/1993 |
| JP | 06-152315 | 5/1994 |
| JP | 06-314631 | 11/1994 |
| JP | 09-238043 | 9/1997 |
| JP | 2001-074467 | 3/2001 |
| JP | 2002-359538 | 12/2002 |

* cited by examiner

*Primary Examiner*—Walter Benson
*Assistant Examiner*—Karen B Addison
(74) *Attorney, Agent, or Firm*—Hogan & Hartson LLP

(57) ABSTRACT

A piezoelectric oscillation element (1) comprising a piezoelectric substrate (10), a first conductor film (21) formed on one main surface of the piezoelectric substrate (10), a second conductor film (22) formed on the other main surface, and grounding terminals (31*a*, 31*b*) formed on the side surfaces of the piezoelectric substrate (10). Specified capacitances are respectively formed between the first and second conductor films (21, 22) formed on the main surfaces of the piezoelectric substrate (10) and the grounding terminals (31*a*, 31*b*) formed on the side surfaces thereof. Larger capacitances can be formed than when electrodes are disposed on the same main surface in proximity of each other to form a capacitance, whereby no adverse effect is given to thickness vibration occurring between the first and second conductor films (21, 22).

12 Claims, 19 Drawing Sheets

PIEZOELECTRIC OSCILLATION ELEMENT AND PIEZOELECTRIC OSCILLATION COMPONENT USING THE SAME

TECHNICAL FIELD

The present invention relates to a small-sized and high-performance piezoelectric oscillation element including a built-in load capacitance, and a piezoelectric oscillation component using the same.

BACKGROUND ART

Conventionally, microcomputers are widely used for communication devices and electronic devices, and as a clock source of such a microcomputer, a piezoelectric oscillation element having a built-in load capacitance has attracted attention. This piezoelectric oscillation element is structured so that load capacitances are connected between input and output terminals of the piezoelectric oscillation element and a ground potential.

As such a piezoelectric oscillation element, there is available one having a vibration electrode and a capacitance electrode on the same main surface of a piezoelectric substrate and a capacitance formed between the oscillation electrode and the capacitance electrode (for example, refer to Patent Document 1). The capacitance electrode is connected to a ground electrode provided on a side surface of the piezoelectric substrate.

With this structure, it becomes unnecessary to provide lamination of a capacitor substrate for forming a capacitance, and the piezoelectric oscillation element can be made thin.

Patent Document 1: Japanese Unexamined Patent Publication No. 03-52312.

DISCLOSURE OF THE INVENTION

Problem to be Solved by the Invention

However, in the above-described conventional piezoelectric element, a capacitance is formed between the oscillation electrode and the capacitance electrode formed on the same main surface of the piezoelectric substrate, so that a region in which thickness vibration is generated and a region in which a capacitance is generated are close to each other.

Therefore, the electric field of the region in which a capacitance is generated influences the electric field of the region in which thickness vibration of the piezoelectric substrate is generated, and may suppress thickness vibration and deteriorate the resonance characteristics.

An object of the present invention is to provide a small-sized thin piezoelectric oscillation element which has a built-in load capacitance and excellent resonance characteristics for thickness vibration and suppresses undesired vibration, and a piezoelectric oscillation component using the same.

Means for Solving the Problem

A piezoelectric oscillation element of the present invention includes a piezoelectric substrate, a first conductor film formed on one main surface of the piezoelectric substrate, a second conductor film formed on the other main surface of the piezoelectric substrate, and ground terminals formed on side surfaces of the piezoelectric substrate, wherein predetermined capacitances are formed between the first and second conductor films and the ground terminals.

In this structure, a capacitance is formed between the first conductor film formed on the one main surface of the piezoelectric substrate and the ground terminal formed on the side surface, and a capacitance is formed between the second conductor film formed on the other main surface of the piezoelectric substrate and the ground terminal formed on the side surface. Therefore, when it is assumed that the gaps of the ends closest to each other of the electrodes are equal to each other, in comparison with the case where the electrodes on the same main surface are formed close to each other and a capacitance is formed, a larger capacitance can be formed. In addition, the first and second conductor films and the ground terminals do not surface-face each other across the piezoelectric substrate, so that thickness vibration is hardly excited there between. Therefore, there is no harmful influence on desired thickness vibration generated between the first and second conductor films, so that the oscillation stability is not lost.

In the piezoelectric oscillation element of the present invention, first and second input/output terminals are formed at positions where the ground terminals are arranged between the first and second input/output terminals on the side surfaces of the piezoelectric substrate, and connection is made between the first conductor film and the first input/output terminal and between the second conductor film and the second input/output terminal.

Therefore, capacitances are generated between the first and second input/output terminals and the ground terminals, and load capacitances necessary for oscillation can be efficiently formed.

Furthermore, the piezoelectric oscillation element of the present invention is structured so that the first conductor film has a first vibration electrode and a first capacitance electrode, and the second conductor film has a second vibration electrode and a second capacitance electrode, and the first and second vibration electrodes face each other by sandwiching the piezoelectric substrate there between.

Thereby, in the region in which the first and second vibration electrodes face each other, thickness vibration can be generated, and a capacitance can be formed between the capacitance electrode and the ground terminal at a position away from the vibration region, so that it can be effectively prevented that desired thickness vibration in the vibration region is suppressed by the electric field formed between the capacitance electrode and the ground terminal and the resonance characteristic is deteriorated.

Insulators may be deposited on the piezoelectric substrate at positions between the first and second capacitance electrodes and the ground terminals. These insulators effectively prevent electrical short circuits between the first and second capacitance electrodes and the ground terminals. Thereby, it becomes possible to narrow the distances between the first and second capacitance electrodes and the ground terminals, and larger capacitances can be formed.

In the piezoelectric oscillation element of the present invention, it is preferable that no electrode is formed in a region facing the first capacitance electrode via the piezoelectric substrate, and no electrode is formed in a region facing the second capacitance electrode via the piezoelectric substrate. That is, the capacitance electrodes have no electrodes facing them via the piezoelectric substrate.

Therefore, the central portion of the facing region most greatly vibrates, and the vibration becomes smaller toward the outside from the facing region. The capacitance electrode and the ground electrode form a capacitance in a region out of the facing region, so that even when an electric field is generated in this remote region, this does not suppress the thickness vibration in the facing region.

A structure may be alternatively employed in which a first auxiliary capacitance electrode is formed in the region facing the first capacitance electrode via the piezoelectric substrate, and a second auxiliary capacitance electrode is formed in the region facing the second capacitance electrode via the piezoelectric substrate. Thereby, much larger capacitances can be formed between the first and second capacitance electrodes and the ground terminals.

In this case, the first auxiliary capacitance electrode is not basically different in potential from the first capacitance electrode, and the second auxiliary capacitance electrode is not basically different in potential from the second capacitance electrode. With these potentials, an electric field is generated neither between the first auxiliary capacitance electrode and the first capacitance electrode nor between the second auxiliary capacitance electrode and the second capacitance electrode. Therefore, the thickness vibration generated in a region in which the first and second vibration electrodes face each other is prevented from being suppressed.

Another structure may be employed in which insulators are deposited on the piezoelectric substrate at positions between the first and second capacitance electrodes and the ground terminals, and insulators are deposited on the piezoelectric substrate at positions between the first and second auxiliary capacitance electrodes and the ground terminals. Thereby, between the first and second capacitance electrodes and the ground terminals and between the first and second auxiliary capacitance electrodes and the ground terminals, electrical short circuits can be effectively prevented. Thereby, the distances between the first and second capacitance electrodes and the ground terminals and between the first and second auxiliary capacitance electrodes and the ground terminals can be narrowed, so that larger capacitances can be formed.

The ground terminals may be made of an elastic material having conductivity. It becomes possible to effectively damp (deaden) undesired vibration generated by electric fields between the capacitance electrodes or auxiliary capacitance electrodes and the ground terminals by the elastic ground terminals, and the problem of deterioration in stability of oscillation due to spurious components generated by undesired vibration can be effectively prevented.

In addition, a first dielectric layer covering apart of the first conductor film and a second dielectric layer covering a part of the second conductor film may further be included, and the ground terminals may be connected to a first ground electrode facing the first conductor film via the first dielectric layer and a second ground electrode facing the second dielectric layer via the second dielectric layer.

With this structure, the first conductor film and the first ground electrode face each other via the first dielectric layer, and the second conductor film and the second ground electrode face each other via the second dielectric layer. Therefore, by forming the first and second dielectric layers so as to be thin by using a high dielectric constant material, large capacitances can be easily formed between the first conductor film and the first ground electrode and between the second conductor film and the second ground electrode. Most of the electric field generated between the first conductor film and the first ground electrode exists in the first dielectric layer, and most of the electric field generated between the second conductor film and the second ground electrode exists in the second dielectric layer, so that the electric fields hardly leak into the piezoelectric substrate. Therefore, electric fields can be effectively suppressed from leaking into the vibration region in which the first and second vibration electrodes face each other across the piezoelectric substrate.

It is a preferable structure in which the first conductor film has the first vibration electrode and the first capacitance electrode, and the second conductor film has the second vibration electrode and the second capacitance electrode, and the first and second vibration electrodes face each other via the piezoelectric substrate.

In this case, it is preferable that the first dielectric layer covers apart of the first capacitance electrode, and that the second dielectric layer covers a part of the second capacitance electrode.

It is also allowed that on one main surface of the piezoelectric substrate, a first auxiliary ground electrode to be connected to the ground terminal is formed between the first capacitance electrode and a side end of the piezoelectric substrate, and that a second auxiliary ground electrode to be connected to the ground terminal is formed between the second capacitance electrode and a side end of the piezoelectric substrate on the other main surface of the piezoelectric substrate. With this structure, in addition to the capacitance formed between the first capacitance electrode and the first ground electrode, a capacitance is also formed between the first capacitance electrode and the first auxiliary ground electrode. In addition to the capacitance formed between the second capacitance electrode and the second ground electrode, a capacitance is also formed between the second capacitance electrode and the second auxiliary ground electrode, so that the overall capacitance can be increased.

The piezoelectric oscillation element of the present invention may have insulation plates deposited so as to cover at least a part of the first ground electrode and at least a part of the second ground electrode. This deposition of the insulators can suppress electrical short circuits between the first and second capacitance electrodes and the first and second ground electrodes.

When the insulation plates have openings surrounding the first and second vibration electrodes, vibration spaces can be secured due to these insulators, so that a piezoelectric oscillation element with excellent resonance characteristics can be obtained.

A piezoelectric oscillation component of the present invention is structured so that the piezoelectric oscillation element structured as described above is sandwiched between protective substrates provided on and under the component. By thus hermetically sealing the piezoelectric oscillation element with the protective substrates, a highly reliable piezoelectric oscillation component can be manufactured.

In further detail, the first conductor film has a first vibration electrode and a first capacitance electrode, the second conductor film has a second vibration electrode and a second capacitance electrode, the upper and lower surfaces of the piezoelectric oscillation element are sandwiched by insulation plates having openings formed so as to surround the first and second vibration electrodes, and protective substrates are deposited on the upper and lower surfaces of the piezoelectric oscillation element via the insulation plates. By employing this structure, a piezoelectric oscillation component which is small in size and excellent in electrical characteristics and reliability can be obtained.

The above-described and other advantages, features, and effects of the present invention will be made clear by the following description of embodiments with reference to the accompanying drawings.

DESCRIPTION OF SYMBOLS

Figure 1:
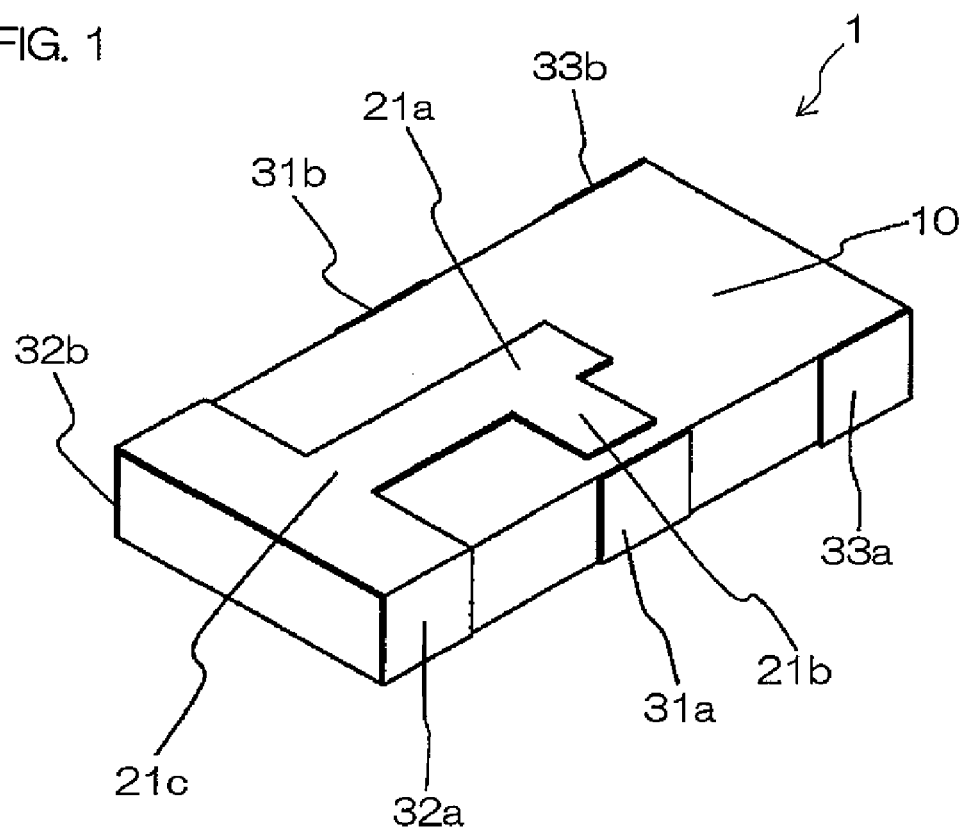
FIG. 1 is an external perspective view showing a piezoelectric oscillation element according to an embodiment of the present invention.

1: Piezoelectric oscillation element
5: Piezoelectric oscillation component
10: Piezoelectric substrate
21a: First vibration electrode
22a: Second vibration electrode
21b: First capacitance electrode
22b: Second capacitance electrode
21c, 22c: Connection electrodes
21d, 22d: Capacitance electrodes
23a, 23b: Auxiliary capacitance electrodes
24a, 24b: Insulators
31a: Ground terminal
31b: Ground terminal
31c: First ground electrode
31d: Second ground electrode
31e: First auxiliary ground electrode
31f: Second auxiliary ground electrode
32a, 32b: First input/output terminals
33a, 33b: Second input/output terminals
35a: First dielectric layer
35b: Second dielectric layer
40a, 40b: Insulation plates
41a, 41b: Openings
50a, 50b, 50c: Protective substrates
60a, 60b, 60c: External electrodes

BEST MODE FOR CARRYING OUT THE INVENTION

Hereinafter, the piezoelectric oscillation element of the present invention will be described in detail with reference to the accompanying drawings.

Figure 2:
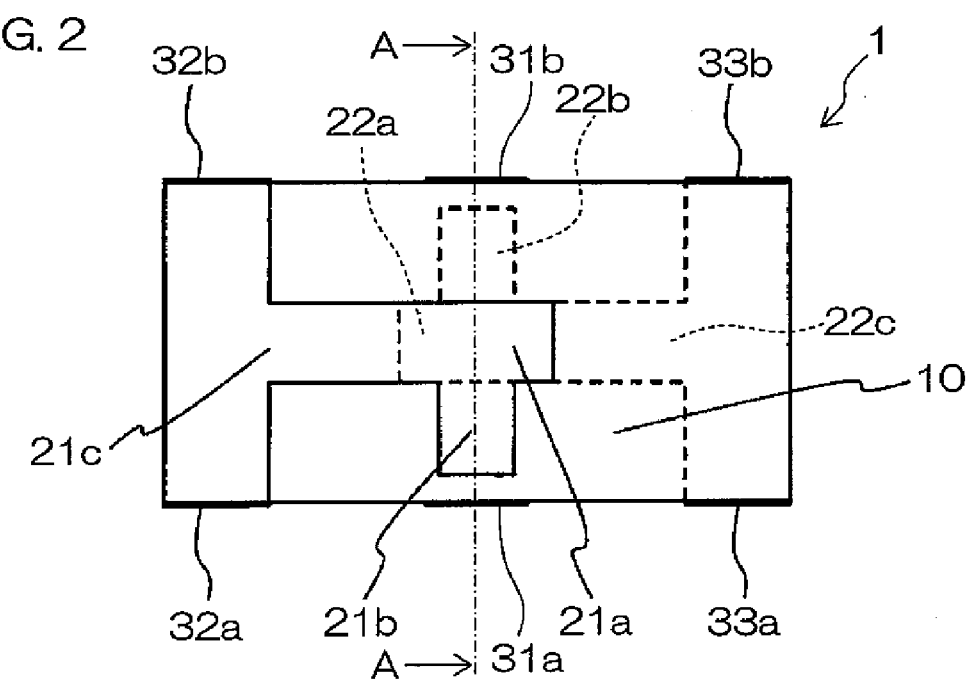
FIG. 2 is a plan view of the same.
Figure 3:
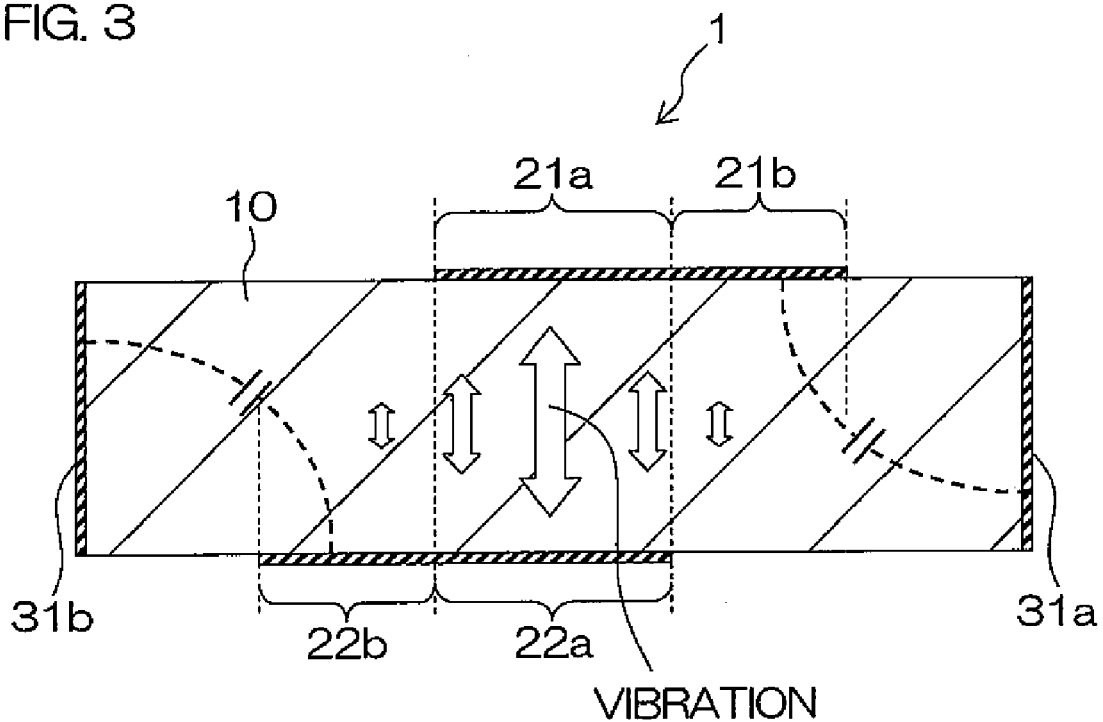
FIG. 3 is a sectional view along A-A of the same.

FIG. 1 is an external perspective view of a piezoelectric oscillation element of an embodiment of the present invention, FIG. 2 is a plan view observed from above, and FIG. 3 is a sectional view along A-A.

The piezoelectric oscillation element 1 includes a piezoelectric substrate 10, a first conductor film 21 (synthesis of 21a, 21b, and 21c in the drawings) deposited on one main surface of the piezoelectric substrate 10, a second conductor film 22 (synthesis of 22a, 22b, and 22c in the drawings) deposited on the other main surface of the piezoelectric substrate 10, ground terminals 31a and 31b deposited on side surfaces of the piezoelectric substrate 10, and first input/output terminals 32a and 32b and second input/output terminals 33a and 33b deposited on the side surfaces of the piezoelectric substrate 10.

The piezoelectric substrate 10 is made of piezoelectric ceramics including a base material such as lead zirconate titanate (PZT), lead titanate (PT), potassium sodium niobate ($Na_{1-x}K_xNbO_3$), bismuth layer-structured compound (for example, $MBi_4Ti_4O_{15}$, M: bivalent alkaline earth metal), or piezoelectric single crystal such as crystal or lithium tantalate. In order to realize a small size and excellent mounting performance on a circuit board, it is desirable that the piezoelectric substrate is in a rectangular parallelepiped shape having a length of 0.6 to 5 mm, a width of 0.3 to 5 mm, and a thickness of 40 μm (micrometers) to 1 mm.

The piezoelectric substrate 10 does not always have to have an even thickness on the entire surface thereof, and for the purpose of improving the resonance characteristics of thickness vibration for energy confinement, for example, it is allowed that the thickness of the vibration region can be made thin or thick.

Preferably, the value of the relative permittivity of the piezoelectric substrate 10 is not more than 1000 for excellent resonance characteristics of a high-frequency region.

When the piezoelectric substrate 10 is made of a ceramic material, it is formed into a sheet according to a method in which a binder is added to a raw material powder and pressed, a method in which the raw material powder is mixed with water and a dispersant and dried by using a ball mill and added with a binder, a solvent, and a plasticizer, etc., and molded according to a doctor blade method, or the like. Next, calcination is performed at a peak temperature of 1100 to 1400° C. for 0.5 to 8 hours, and then polarization is applied by applying a voltage of 3 to 6 kV/mm in the thickness direction at a temperature of 80 to 200° C., whereby a piezoelectric substrate 10 with desired piezoelectric characteristics is obtained.

When the piezoelectric substrate 10 is made of a piezoelectric single crystal material, by cutting an ingot (base metal) of the piezoelectric single crystal material which becomes the piezoelectric substrate 10 so as to have a predetermined crystal direction, a piezoelectric substrate 10 having desired piezoelectric characteristics is obtained.

The first conductor film 21 is deposited on the one main surface of the piezoelectric substrate 10, and includes a first vibration electrode 21a, a first capacitance electrode 21b extended from the first vibration electrode 21a toward the ground terminal 31a, and a connection electrode 21c for electrically connecting the first vibration electrode 21a and the first input/output terminals 32a and 32b.

Similarly, the second capacitance electrode 22 is deposited on the other main surface of the piezoelectric substrate 10, and includes a second vibration electrode 22a, a second capacitance electrode 22b extended from the second vibration electrode 22a toward the ground terminal 31b, and a connection electrode 22c for electrically connecting the second vibration electrode 22a and the second input/output terminals 33a and 33b.

The first vibration electrode 21a and the second vibration electrode 22a are arranged so as to face each other by sandwiching the piezoelectric substrate 10 therebetween. The region in which these first and second vibration electrodes 21a and 22a face each other is referred to as a "facing region."

In regions facing the first capacitance electrode 21b and the connection electrode 21c via the piezoelectric substrate 10, no electrode is formed to prevent excitation of extra thickness vibration.

In the regions facing the second capacitance electrode 22b and the connection electrode 22c, no electrode is formed, either, to prevent excitation of extra thickness vibration.

In the facing region, an electric field is applied between the first vibration electrode 21a and the second vibration electrode 22a, and energy confinement type thickness vibration is excited. For the thickness vibration, a fundamental wave of the thickness longitudinal vibration or higher harmonic can be used. A region in which this thickness vibration is excited is referred to as a "vibration region." The vibration region includes the facing region in which the first vibration electrode 21a and the second vibration electrode 22a face each other and regions near the facing region (see FIG. 3).

Preferably, the first conductor film 21 and the second conductor film 22 are formed of a metal film of gold, silver, copper, aluminum, etc. in terms of conductivity, and desirably, its thickness is in a range of 0.1 μm to 3 μm. If the metal film is thinner than 0.1 μm, the conductivity deteriorates due to oxidation caused when the piezoelectric substrate 10 is exposed to a high temperature in the atmosphere, and if the metal film is made thicker than 3 μm, the film easily peels off.

For forming the metal film, coating and baking by vacuum deposition, PVD, sputtering, or thick-film printing can be used. For increasing the adhesion to the piezoelectric substrate 10, for example, an underlying electrode layer with high adhesion to the ceramic substrate, such as Cr, may be formed in advance, and a desired metal film may be formed thereon.

After depositing the metal film on both entire main surfaces of the piezoelectric substrate 10, a photoresist film with a thickness of 1 to 10 μm is formed on the piezoelectric substrate 10 by spin coating, etc., and patterned by photo etching to form electrodes.

The ground terminals 31a and 31b are deposited near the centers of the side surfaces of the piezoelectric substrate 10, and the ground terminal 31a is arranged near the first capacitance electrode 21 band the ground terminal 31b is arranged near the second capacitance electrode 22b, and these are both connected to a ground potential.

The first input/output terminals 32a and 32b and the second input/output terminals 33a and 33b are deposited on the both side surfaces of the piezoelectric substrate 10.

The first input/output terminal 32a and the second input/output terminal 33a are arranged so as to sandwich the ground terminal 31a, and the first input/output terminal 32b and the second input/output terminal 33b are arranged so as to sandwich the ground terminal 31b. The first input/output terminals 32a and 32b are connected via the connection electrode 21c, and the second input/output terminals 33a and 33b are connected via the connection electrode 22c.

These ground terminals 31a and 31b, first input/output terminals 32a and 32b, and second input/output terminals 33a and 33b are used for electrical connection and mechanical fixture of the piezoelectric oscillation element 1 to the outside.

The ground terminals 31a and 31b and the input/output terminals 32a, 32b, 33a and 33b are desirably made of an elastic material having conductivity such as a conductive resin.

By using a conductive resin, it becomes possible to damp undesired vibration excited between the first and second capacitance electrodes 21b and 22b provided on the outer peripheral edge of the main surfaces of the piezoelectric substrate 10 and the ground terminals 31a and 31b provided on the side surfaces of the piezoelectric substrate 10, and a piezoelectric oscillation element 1 with more excellent resonance characteristics can be obtained.

It is desirable that the thickness of the conductive resin is not less than 5 μm in terms of the high effect of damping undesired vibration. However, if it is excessively made thick, the resin becomes easy to peel off from the piezoelectric substrate 10 due to a stress working at mounting, so that the range of 10 μm to 60 μm is especially desirable. The elastic modulus of the conductive resin in a range of 2 to 60 GPa can bring about a sufficient damping effect.

For forming such a conductive resin, a thermosetting or photo-curable conductive resin may be applied by using screen printing, roller transfer or the like and cured by heating or ultra violet irradiation. As a foundation layer of the conductive resin, a metal film of gold, silver, copper, aluminum, etc. may be formed. Furthermore, on the surface of the conductive resin, at least one kind of plating film using Cu, Ni, Sn, Au, etc. is formed, whereby a piezoelectric oscillation element excellent in solderability is obtained.

In terms of excellent conductivity and easiness in plating film formation, it is desirable that the conductive resin contains at least one kind of metal filler using Ag, Cu, Ni, etc., and it is desirable that the amount of the metal filler in the conductive resin is 75 to 95 weight %. In terms of improvement in solder wettability of the plating film, in order to make the conductive resin surface smooth, the particle diameter of the metal filler is preferably smaller. For example, it is desirable that its average particle diameter is 0.5 to 2 μm.

When an alternating voltage is applied to the input/output terminals $32a$, $32b$, $33a$ and $33b$ of this piezoelectric oscillation element 1, energy confinement type thickness vibration is excited in the vibration region sandwiched between the first vibration electrode $21a$ and the second vibration electrode $22a$ of the piezoelectric substrate 10, and a resonance peak caused by the vibration appears in the frequency characteristics. The piezoelectric oscillation element 1 of the present invention uses the resonance phenomenon caused by such thickness vibration.

Figure 4:
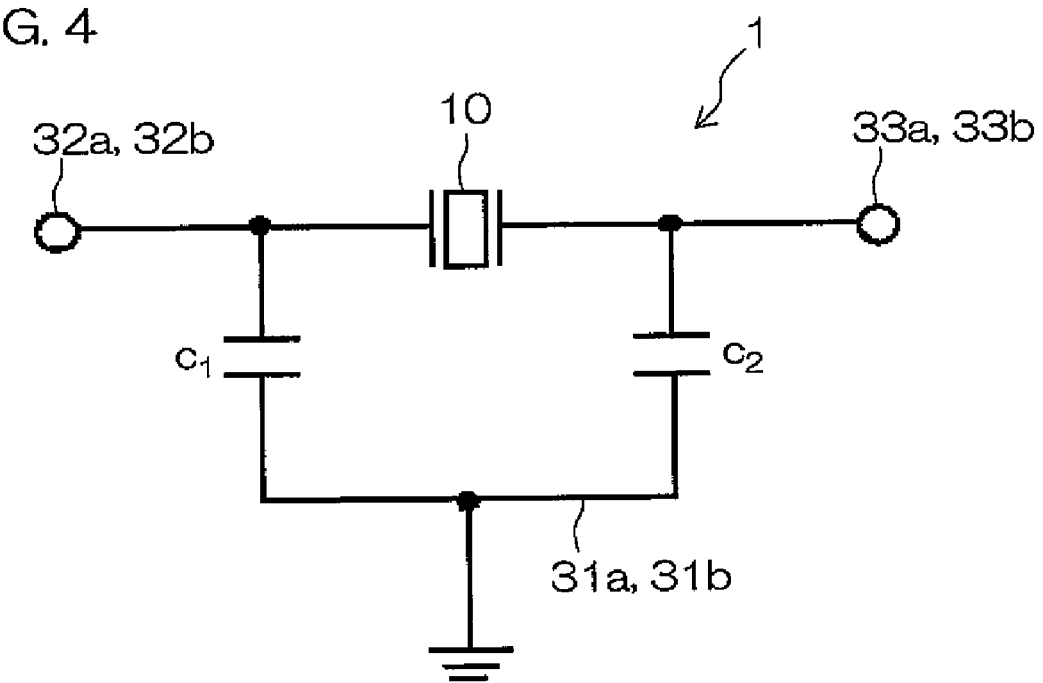
FIG. 4 is an equivalent circuit diagram of the piezoelectric oscillation element of the present invention.

FIG. 4 is an equivalent circuit diagram of the piezoelectric oscillation element.

The capacitance between the first capacitance electrode $21b$ and the ground terminal $31a$, the capacitance between the first input/output terminal $32a$ and the ground terminal $31a$, and the capacitance between the first input/output terminal $32b$ and the ground terminal $31b$ form a load capacitance c1 shown in FIG. 4.

The capacitance between the second capacitance electrode $22b$ and the ground terminal $31b$, the capacitance between the second input/output terminal $33a$ and the ground terminal $31a$, and the capacitance between the second input/output terminal $33b$ and the ground terminal $31b$ form a load capacitance c2 shown in FIG. 4.

Thus, between the input/output terminals $32a$, $32b$, $33a$ and $33b$ and the ground terminals $31a$ and $31b$, load capacitances c1 and c2 are formed, and a piezoelectric oscillation element including a load capacitance as a whole is obtained.

The piezoelectric oscillation element 1 of this embodiment can form a larger capacitance when the gaps of the electrode ends closest to each other are equal to each other in comparison with the case where a capacitance is formed by arranging electrodes close to each other on the same main surface of the piezoelectric substrate. Therefore, the piezoelectric oscillation element 1 has a larger load capacitance.

As shown in FIG. 3, at positions away from the vibration region in which the first and second vibration electrodes $21a$ and $22a$ are formed, capacitances are formed between the first and second capacitance electrodes $21b$ and $22b$ and the ground terminals $31a$ and $31b$, so that it is effectively prevented that the electric fields formed between these electrodes suppress desired vibration in the vibration region to deteriorate the resonance characteristics.

Furthermore, in the piezoelectric oscillation element 1 of this embodiment, on the side surfaces of the piezoelectric substrate 10, the input/output terminals $32a$ and $33a$ are formed so as to sandwich the ground terminal $31a$, and the input/output terminals 32 band $33b$ are formed so as to sandwich the ground terminal $31b$, so that capacitances are generated even between the ground terminals $31a$ and $31b$ and the input/output terminals $32a$, $32b$, $33a$ and $33b$, so that a load capacitance necessary for oscillation can be increased.

In this piezoelectric oscillation element 1, as described above, a large load capacitance can be structurally formed, so that it becomes possible to use a PT ($PbTiO_3$)-based material whose relative permittivity is small although its Qm is high, and a high-performance piezoelectric element having a built-in load capacitance can be obtained.

Figure 5:
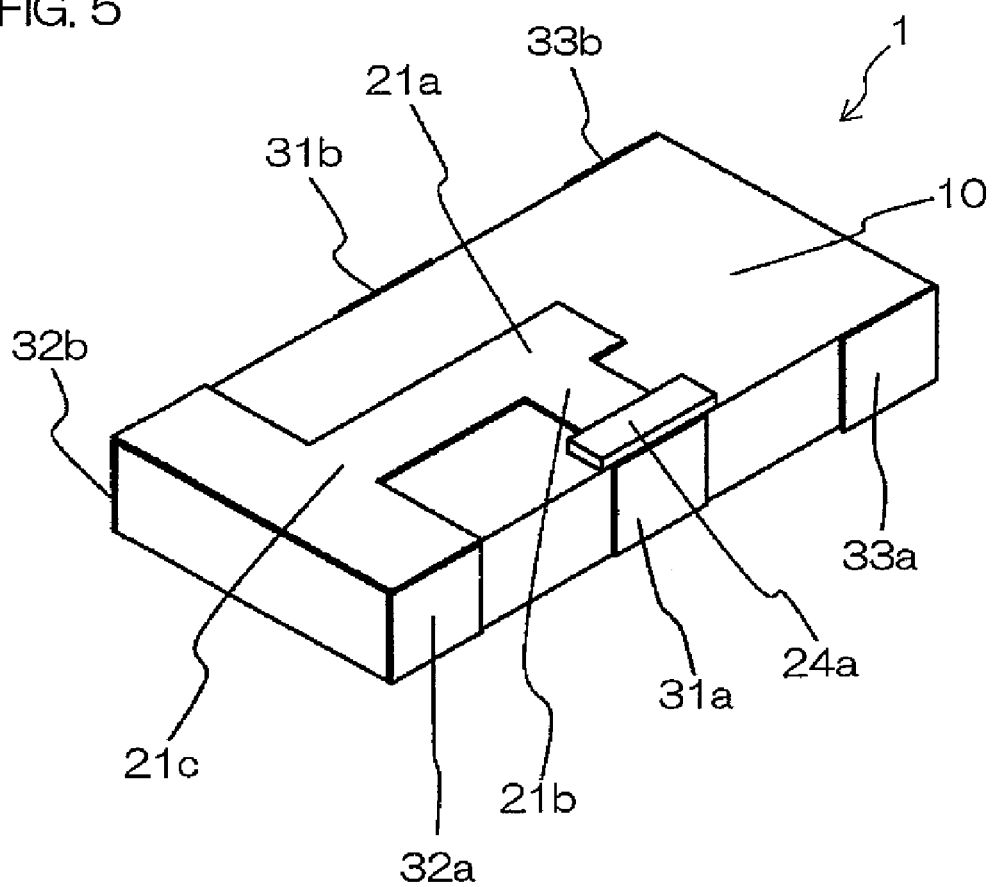
FIG. 5 is an external perspective view showing a piezoelectric oscillation element according to an embodiment of the present invention on which an insulator is deposited.
Figure 6:
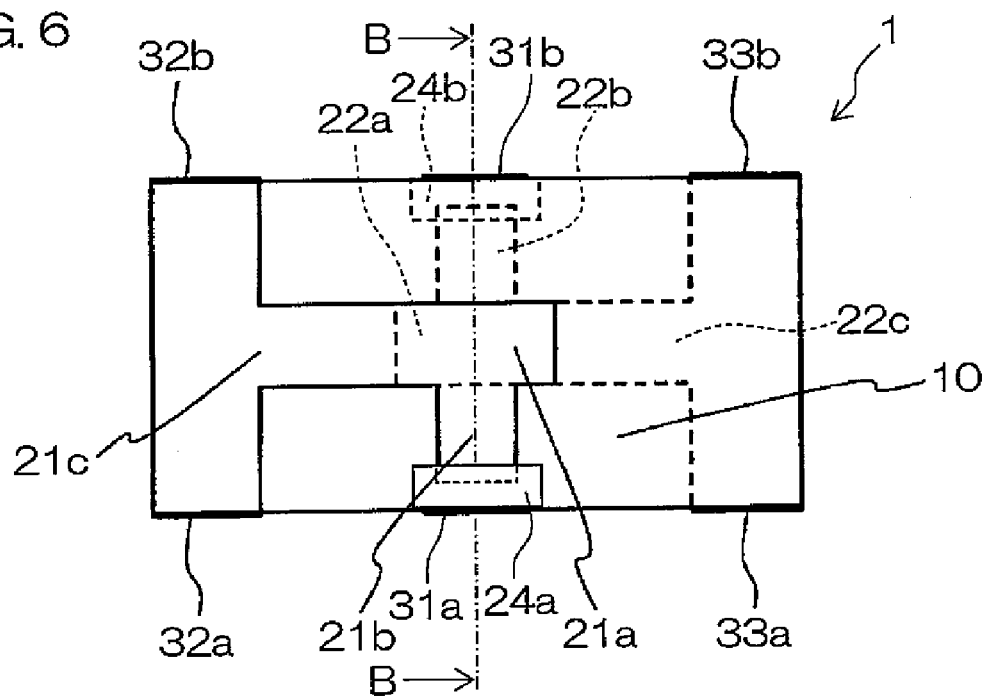
FIG. 6 is a plan view of the same.
Figure 7:
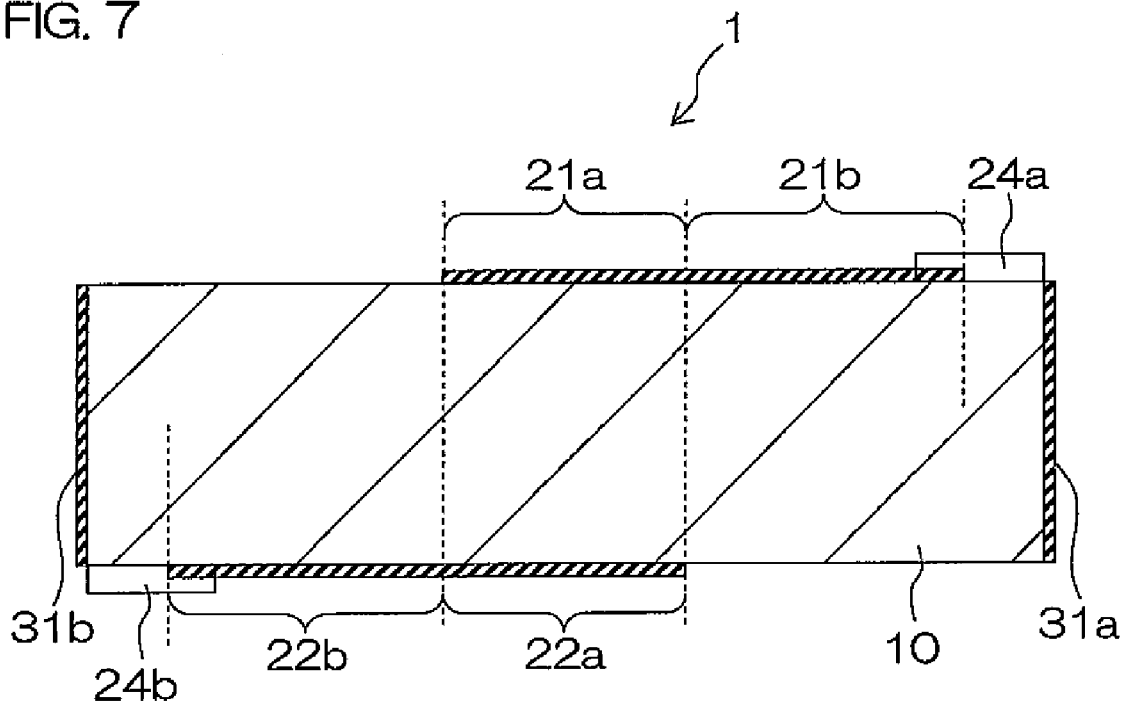
FIG. 7 is a sectional view along B-B of the same.

FIG. 5 is an external perspective view showing a piezoelectric oscillation element having another structure, FIG. 6 is a plan view observed from above, and FIG. 7 is a sectional view along B-B. Only differences from the above-described embodiment will be described, and description of the same components will be omitted by using the same reference numerals (the same applies to the following).

A structural difference of this piezoelectric oscillation element from the piezoelectric oscillation element shown in FIG. 1 through FIG. 3 is that an insulator $24a$ is deposited on the piezoelectric substrate 10 at a position between the first capacitance electrode $21b$ and the ground terminal $31a$, and an insulator $24b$ is deposited on the piezoelectric substrate 10 at a position between the second capacitance electrode $22b$ and the ground terminal $31b$.

For the insulators $24a$ and $24b$, a resin material such as phenol-based resin, polyimide-based resin, and epoxy-based resin can be used. An epoxy-based resin is desirably used due to its excellent insulation, adhesion to ceramic, and excellent moisture resistance. Preferably, the epoxy-based resin is a curable type which does not cause hydrolysis, and epoxy-based resin added with particles of rutile type titanium oxide, etc. for the purpose of lowering water permeability, added with 2-4 diamino-6 vinyl-S triamine and isocyanuric acid for the purpose of improving insulation, and added with a proper amount of carbon black for the purpose of preventing permeation of moisture due to cleaving of the main chain of the resin may be used.

When a resin material is used as the insulators $24a$ and $24b$, for example, a thermosetting or photo-curable resin is applied with a thickness of 1 to 80 μm onto the piezoelectric substrate 10 by screen printing, etc., and cured by heating or ultra violet irradiation.

By thus depositing the insulators $24a$ and $24b$ on the piezoelectric substrate 10, electrical short circuits due to insulation breakdown, migration or manufacturing failures between the first and second capacitance electrodes $21b$ and $22b$ and the ground terminals $31a$ and $31b$ can be effectively prevented. Thereby, without fearing short circuits, the distances between the first and second capacitance electrodes $21b$ and $22b$ and the ground terminals $31a$ and $31b$ can be further narrowed, whereby a large capacitance can be formed.

Figure 8:
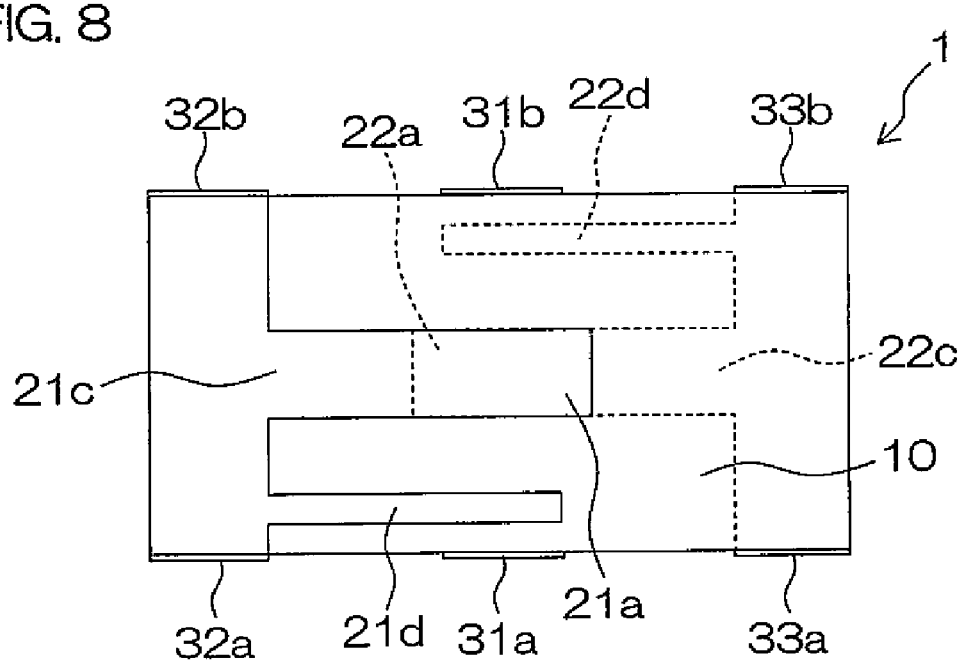
FIG. 8 is a plan view showing a piezoelectric oscillation element according to another embodiment of the present invention.

FIG. 8 is a plan view observed from above a piezoelectric oscillation element according to another embodiment of the present invention.

In the piezoelectric oscillation element 1 shown in FIG. 8, on one main surface of the piezoelectric substrate 10, a first capacitance electrode $21d$ is provided so as to extend from the connection electrode $21c$ of the first conductor film 21, and on the other main surface of the piezoelectric substrate 10, a second capacitance electrode $22d$ is provided so as to extend from the connection electrode $22c$ of the second conductor film 22. The first capacitance electrode $21d$ is closer to the ground terminal $31a$, and the second capacitance electrode $22d$ is closer to the ground terminal $31b$. No electrode is formed in the region facing the first capacitance electrode $21d$ via the piezoelectric substrate 10. No electrode is formed also in the region facing the second capacitance electrode $22d$.

In this structure, the function of forming capacitances by the capacitance electrodes $21d$ and $22d$ between the same and the ground terminals $31a$ and $31b$ is the same as in the capacitance electrodes $21b$ and $22b$.

With this structure, the capacitance between the ground terminal $31a$ and the first input/output terminal $32a$ can be increased, and the capacitance between the ground terminal $31b$ and the second input/output terminal $33b$ can be increased.

With this structure, it becomes unnecessary to form an extra electrode pattern near the vibration region, and it becomes possible to reduce harmful influence of the electrode mass effect and the like on the desired thickness vibration.

Figure 9:
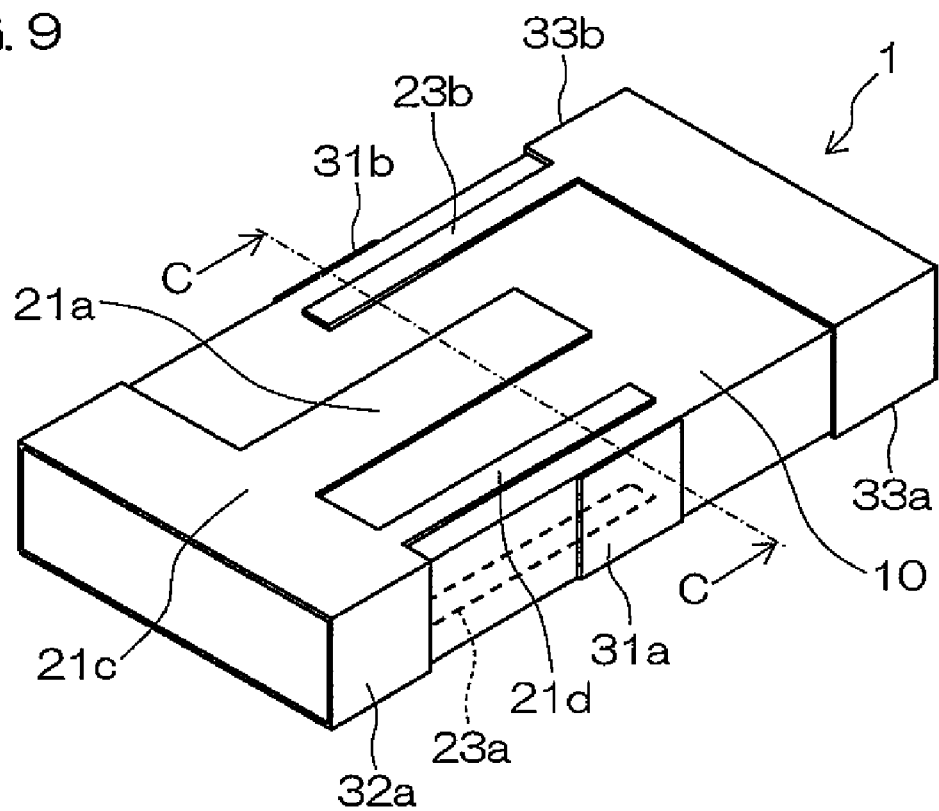
FIG. 9 is an external perspective view of the piezoelectric oscillation element according to another embodiment of the present invention.
Figure 10:
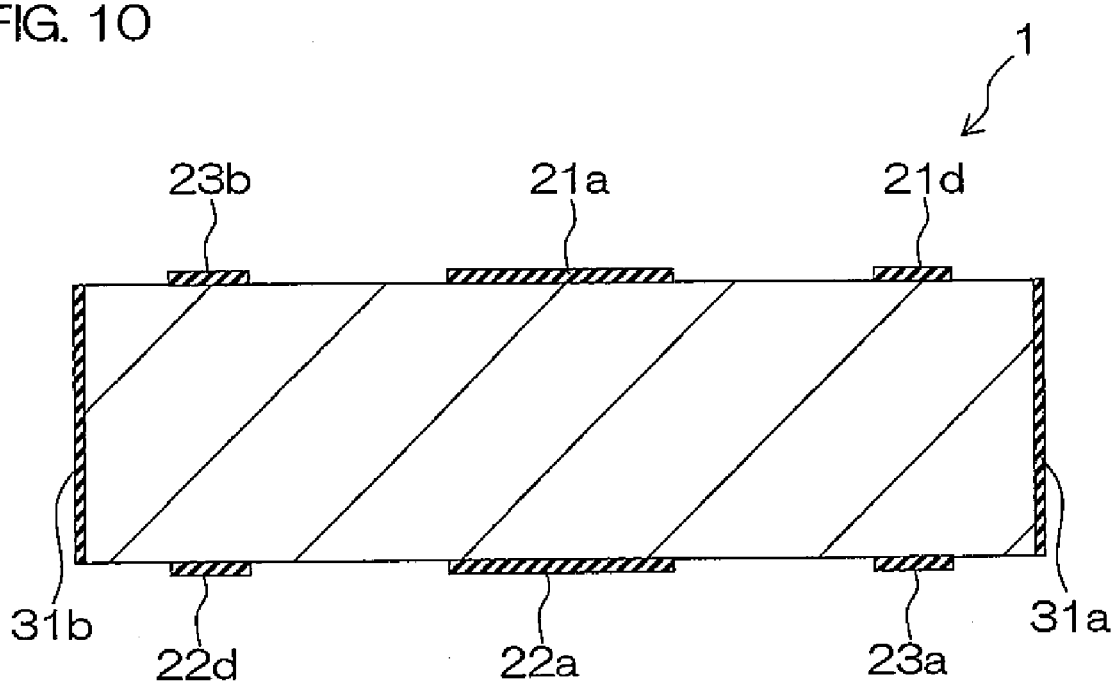
FIG. 10 is a sectional view along C-C of the same.

FIG. 9 is a perspective view of the piezoelectric oscillation element according to a variation of FIG. 8, and FIG. 10 is a sectional view along C—C.

A first auxiliary capacitance electrode 23a is formed in the region facing the first capacitance electrode 21d via the piezoelectric substrate 10, and a second auxiliary capacitance electrode 23b is formed in a region facing the second capacitance electrode 22d. The first auxiliary capacitance electrode 23a is connected to the first input/output terminal 32a, and the second auxiliary capacitance electrode 23b is electrically connected to the second input/output terminal 33b. Therefore, the first auxiliary capacitance electrode 23a basically becomes equal in potential to the first capacitance electrode 21d, and the second auxiliary capacitance electrode 23b basically becomes equal in potential to the second capacitance electrode 22d.

With this structure, in comparison with the structure of FIG. 8, due to addition of the auxiliary capacitance electrodes 23a and 23b, capacitances are also formed between the auxiliary capacitance electrodes 23a and 23b and the ground terminals 31a and 31b, so that the load capacitances c1 and c2 in the equivalent circuit diagram shown in FIG. 4 can be made much larger.

An electric field is generated neither between the first auxiliary capacitance electrode 23a and the first capacitance electrode 21d nor between the second auxiliary capacitance electrode 23b and the second capacitance electrode 22d. Therefore, no electric field leaks into the vibration region in which the first and second vibration electrodes 21d and 22d face each other across the piezoelectric substrate 10.

Figure 11:
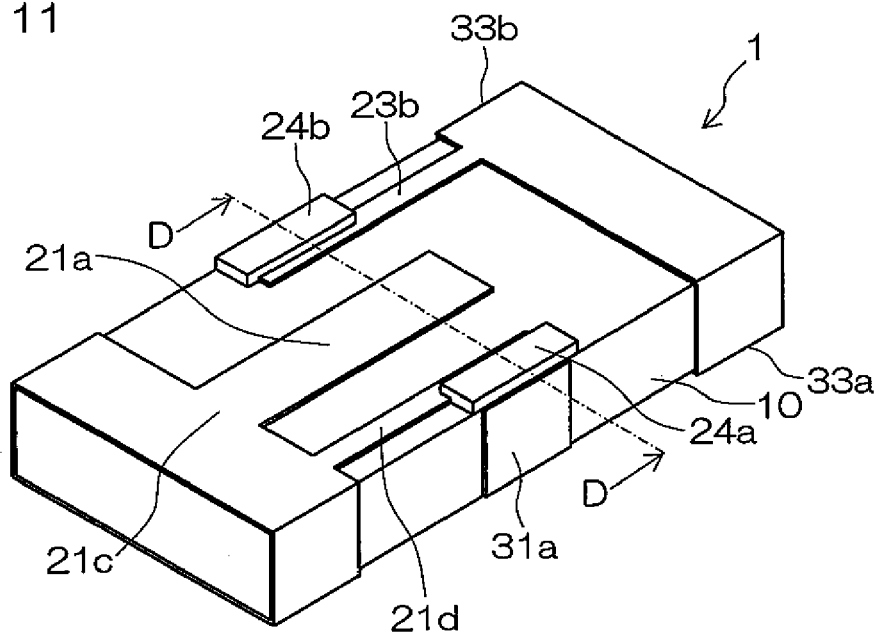
FIG. 11 is an external perspective view showing a piezoelectric oscillation element according to another embodiment of the present invention on which insulators are deposited.
Figure 12:
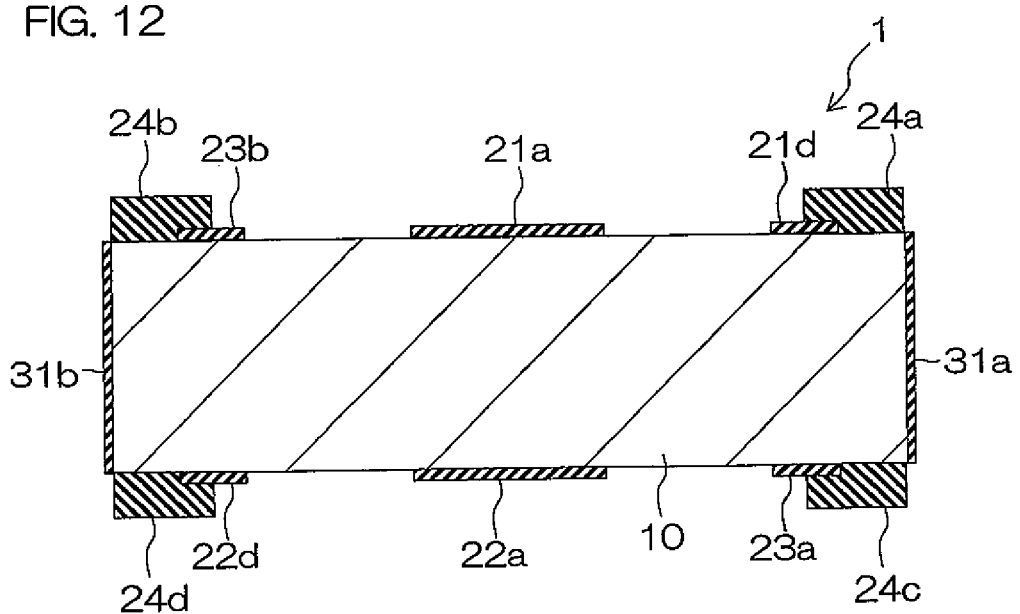
FIG. 12 is a sectional view along D-D of the same.

FIG. 11 is a perspective view of a piezoelectric oscillation element obtained by adding insulators to the piezoelectric oscillation element of FIG. 9, and FIG. 12 is a sectional view along D-D.

In this piezoelectric oscillation element, on one main surface of the piezoelectric substrate 10, an insulator 24a is deposited on the piezoelectric substrate 10 at a position between the first capacitance electrode 21d and the ground terminal 31a, and an insulator 24b is deposited on the piezoelectric substrate 10 at a position between the second auxiliary capacitance electrode 23b and the ground terminal 31b. Also on the other main surface of the piezoelectric substrate 10, an insulator 24c is deposited on the piezoelectric substrate 10 at a position between the first auxiliary capacitance electrode 23a and the ground terminal 31a, and an insulator 24d is deposited on the piezoelectric substrate 10 at a position between the second capacitance electrode 22d and the ground terminal 31b.

In this structure, electrical short circuits of the first and second capacitance electrodes 21d and 22d and the first and second auxiliary capacitance electrodes 23a and 23b with the ground terminals 31a and 31b can be effectively prevented.

In addition, it becomes possible to effectively narrow the distances from the first and second capacitance electrodes 21d and 22d and the first and second auxiliary capacitance electrodes 23a and 23b to the ground terminals 31a and 31b, so that a larger capacitance can be formed.

Figure 13:
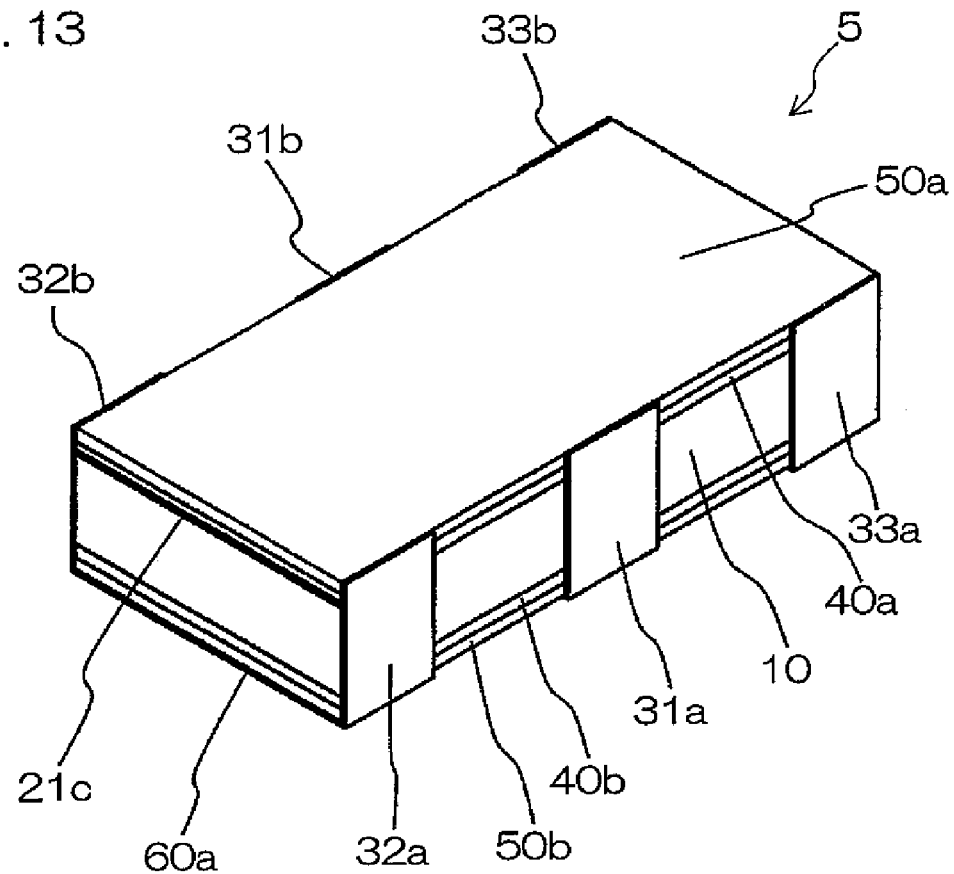
FIG. 13 is an external perspective view showing a piezoelectric oscillation component according to another embodiment of the present invention.
Figure 14:
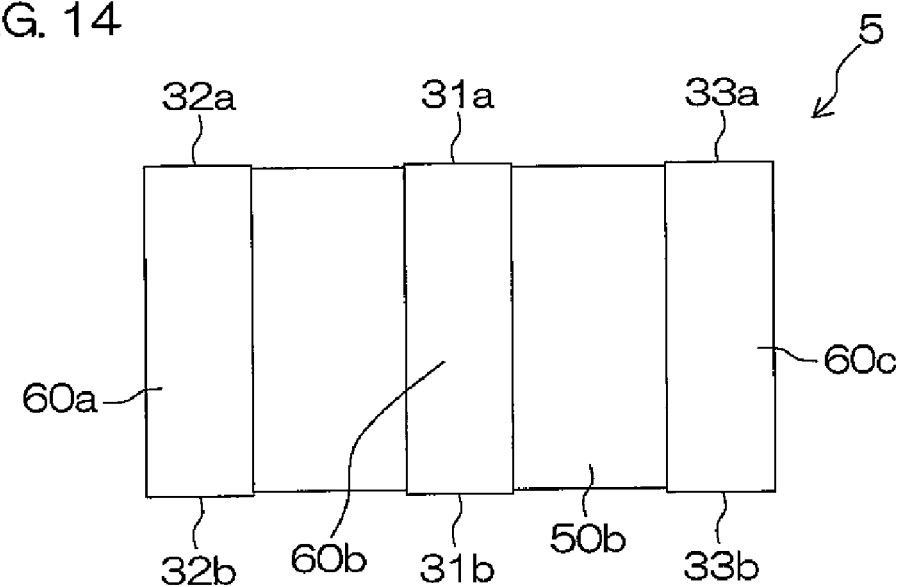
FIG. 14 is a plan view observed from below.
Figure 15:
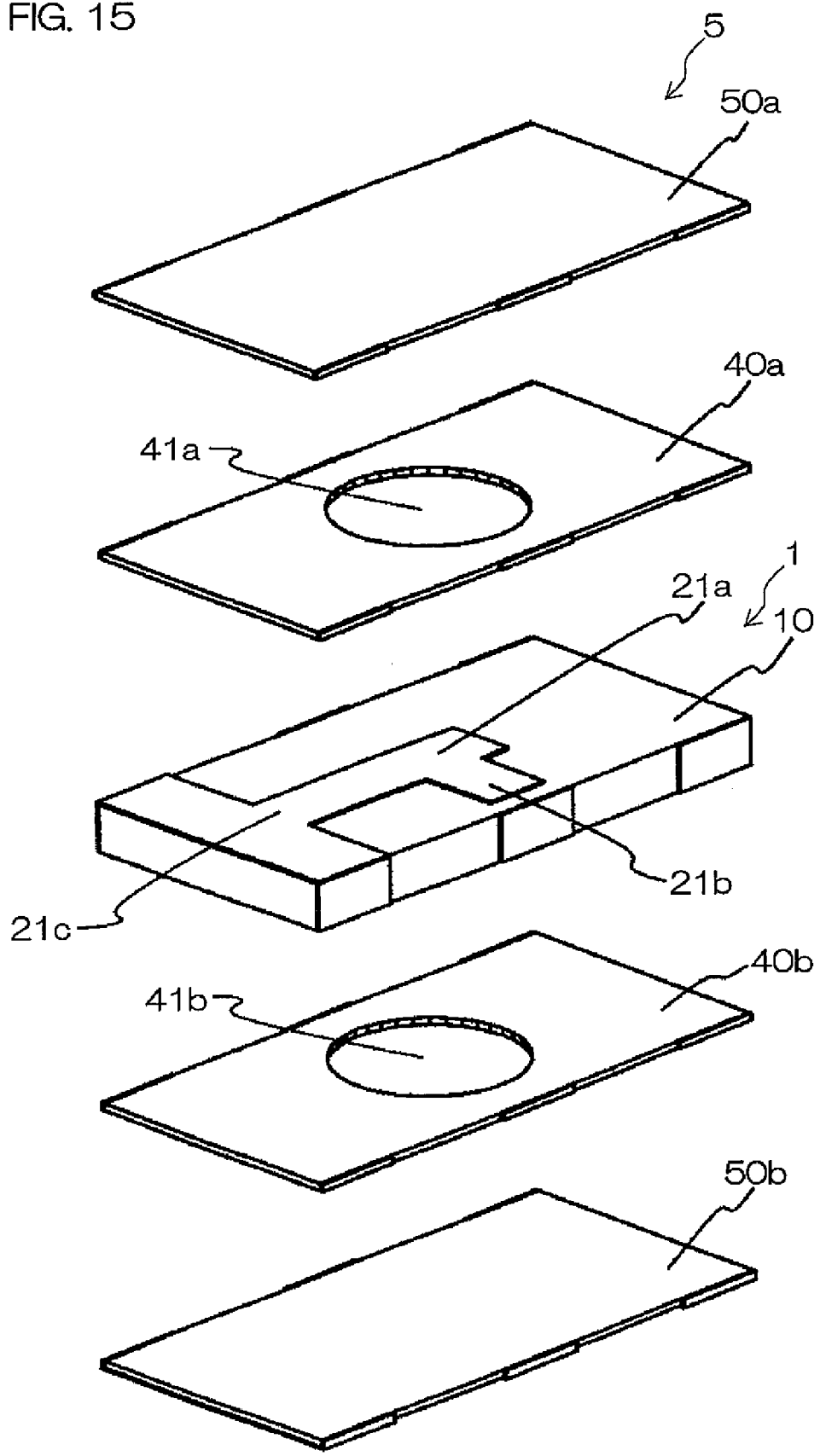
FIG. 15 is an exploded perspective view of the piezoelectric oscillation component.
Figure 16:
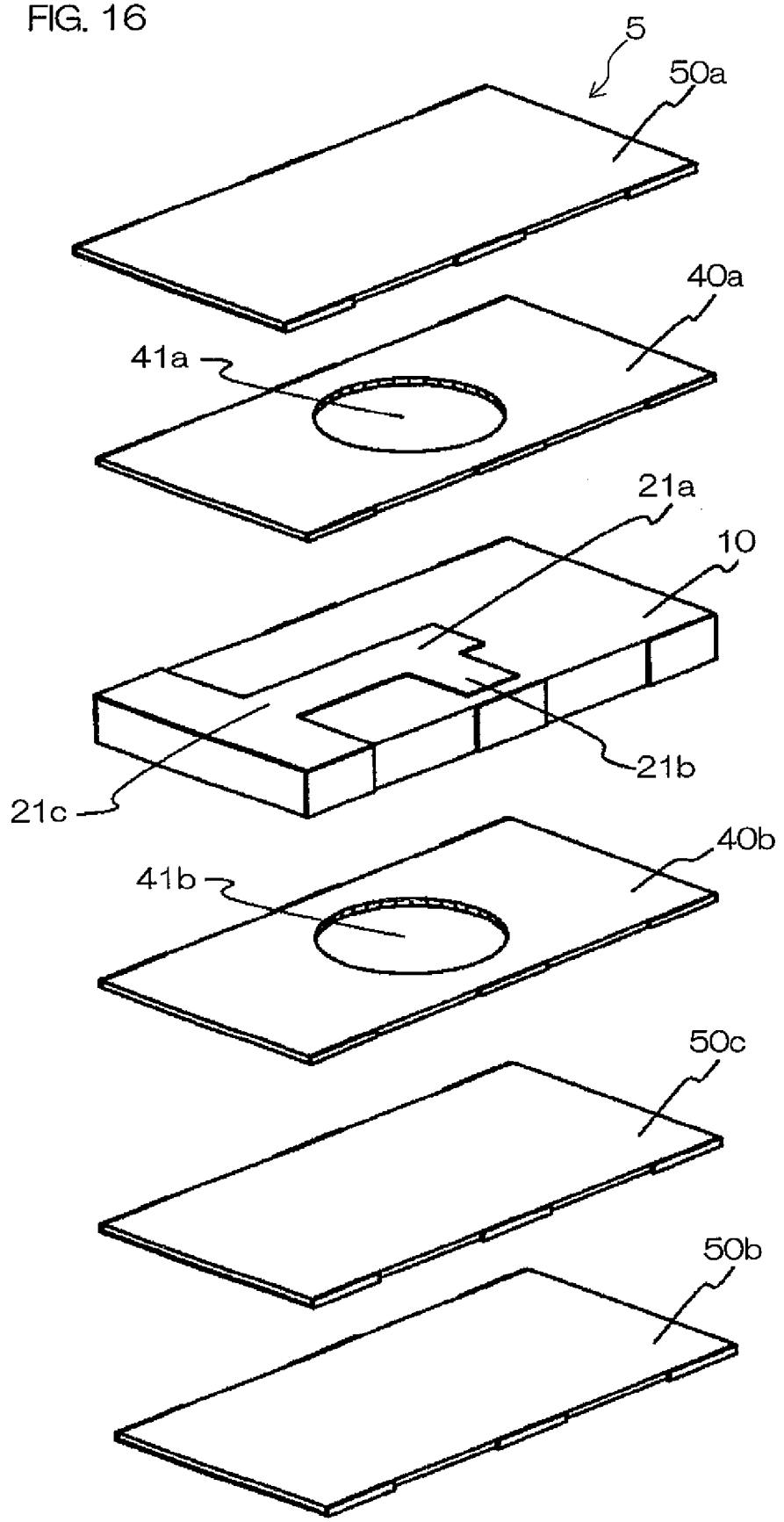
FIG. 16 is an exploded perspective view of the piezoelectric oscillation component.

FIG. 13 is an external perspective view showing a piezoelectric oscillation component using the piezoelectric oscillation element of the present invention, FIG. 14 is a plan view observed from below, and FIG. 15 and FIG. 16 are exploded perspective views.

In the piezoelectric oscillation component 5 having this structure, protective substrates 50a and 50b are deposited on upper and lower surfaces of the piezoelectric oscillation element 1 via insulation plates 40a and 40b.

These insulation plates 40a and 40b have a function of effectively preventing electrical short circuits due to insulation breakdown, migration, manufacturing failures or the like between the first and second capacitance elements 21b and 22b and the ground terminals 31a and 31b similar to the above-described insulators 24a and 24b.

For the insulation plates 40a and 40b, a resin material using, for example, a phenol-based resin, a polyimide-based resin, an epoxy-based resin, etc. as a base material can be used. A base material of an epoxy-based resin is desirably used due to its excellent insulation, high adhesion to ceramic, and excellent moisture resistance and heat resistance. Preferably, the epoxy-based resin is a curable type which does not cause hydrolysis, and if required, the epoxy-based resin may be added with rutile type titanium oxide for the purpose of lowering water permeability, added with 2-4 diamino-6 vinyl-S triamine and isocyanuric acid for the purpose of improving insulation, or added with a proper amount of carbon black for the purpose of preventing permeation of moisture due to cleaving of the main chain of the resin.

With respect to such a resin material, for example, a thermosetting or light-curable resin is applied with a thickness of 1 to 80 μm onto the piezoelectric substrate 10 by screen printing, transfer, etc., and only a desired part is cured by heating, ultra violet irradiation or the like to form insulation plates 40a and 40b in desired shapes.

For the protective substrates 50a and 50b, a dielectric ceramic material such as alumina, titanium oxide, magnesium oxide, barium titanate, etc. can be used, so that it becomes possible to form a large capacitance by using the protective substrates 50a and 50b. In this case, desirably, dielectric ceramic with a relative permittivity of about 200 to 2500 is used.

Furthermore, on the lower surface of the piezoelectric oscillation component 5, external electrodes (general term: external electrode 60) including a plurality of electrodes 60a through 60c are deposited. The terminals of the external electrode 60a are connected to the first input/output terminals 32a and 32b, the external electrode 60b is connected to the ground terminals 31a and 31b, and the external electrode 60c is connected to the second input/output terminals 33a and 33b, respectively.

Therefore, the capacitance formed between the external electrodes 60a and 60b is added to the load capacitance c1 of FIG. 2, and the capacitance formed between the external electrodes 60c and 60b is added to the load capacitance c2 of FIG. 2, so that a much larger total load capacitance can be formed.

When the protective substrates 50a and 50b are made of a ceramic material, the external electrode 60 may be formed of a favorable conductor film of Ag, etc. by vapor deposition, sputtering or the like, formed by baking a conductive paste, or formed by using a conductive resin.

Not only the external electrode 60 but also the input/output terminals 32a and 32b, the input/output terminals 33a and 33b, and the ground terminals 31a and 31b can be formed by depositing a conductive resin.

For deposition of this conductive resin, a thermosetting or light-curable conductive resin is applied by screen printing, roller transfer or the like, and cured by heating or ultra violet irradiation. By forming at least one kind of plating film using Cu, Ni, Sn, Au, etc. on the surface of the conductive resin, a piezoelectric oscillation component excellent in solderability can be obtained.

For realizing excellent conductivity and easy formation of plating film, it is desirable that the conductive resin contains at least one kind of metal filler using Ag, Cu, Ni, etc., and that the amount of the metal filler contained in the conductive resin is 75 to 95 weight %. For smoothing the surface of the conductive resin to improve the solder wettability of the plating film, the particle size of the metal filler is preferably smaller, and for example, a metal filler with an average particle size of 0.5 to 2 μm is desirably used.

In the piezoelectric oscillation component 5 of this embodiment, as shown in FIG. 13 and FIG. 15, protective substrates 50a and 50b are deposited on both main surfaces of the piezoelectric oscillation element 1 via annular insulation plates 40a and 40b formed so as to surround the first and second vibration electrodes 21a and 22a.

Therefore, in the vicinity of centers of the insulation plates 40a and 40b, openings 41a and 41b are formed. While vibration spaces are secured by these openings 41a and 41b, hermetic sealing can be realized by the protective substrates 50a and 50b, so that a piezoelectric oscillation component which can be used independently without separately preparing an airtight package is obtained.

In addition, the insulation plates 40a and 40b also function to prevent electrical short circuits between the capacitance electrodes and auxiliary capacitance electrodes and the ground terminals, whereby a piezoelectric oscillation component small in size and excellent in electrical characteristics and reliability can be obtained.

In this piezoelectric oscillation component 5, when protective substrates 50a and 50b made of ceramics with a high relative permittivity are used, it becomes possible to make thin the protective substrates 50a and 50b, so that the piezoelectric oscillation component 5 can be made thin.

In the above-described embodiment, a ceramic material is used for the protective substrates 50a and 50b. However, if the ceramic material is made thin for making the protective substrates thin, an extra step is needed in polishing. If the substrate is reduced in thickness to 100 μm or less, the substrate becomes easy to crack and handling thereof becomes difficult.

Therefore, when the piezoelectric oscillation component 5 is made thin, a resin sheet material which does not crack even when it is made thin and is low in cost may be used for the protective substrates 50a and 50b.

A resin sheet material with a thickness of not more than 100 μm is generally usable and reduction in cost can be realized.

As the resin sheet material, an epoxy-based resin, polyimide-based resin, liquid crystal polymer (LCP), polyethyletherketone (PEEK), etc., may be used. In terms of realizing a reduction in thickness and airtightness of the piezoelectricoscillation component 5, the thickness of the resin sheet material is desirably 20 to 100 μm.

When the thin resin sheet material is used, for the purpose of improving the mechanical strength as the protective substrate, if required, a resin sheet material containing a needle-like filler or fiber material made of an inorganic or organic material may be used.

In order to prevent the resin sheet material from being deformed or torn by an external force from above or below, it is especially desirable to use a resin sheet material (prepreg) obtained by impregnating an epoxy-based resin, a polyimide-based resin or the like in a fabric made of glass fibers or aramid fibers, and the mechanical strength of the resin sheet material can be significantly improved by these fibers.

By forming the protective substrates 50a and 50b of resin sheets and forming the ground terminals 31a, 31b, the input/output terminals 32a, 32b, 33a and 33b and the external electrode 60 from a conductive resin, both of these are made of resin materials, so that adhesion there between is increased, and as a result, terminals and electrodes excellent in adhesion are formed.

In the piezoelectric oscillation component 5 of the above-described embodiment, the protective substrates 50a and 50b are made of dielectric ceramic or resin sheet materials. However, it is also allowed that, for example, the upper protective substrate 50a is formed of a thin resin sheet material, and that the lower protective substrate 50b is made of dielectric ceramics with a low relative permittivity of 10 or less and a high strength such as alumina. Thereby, a load capacitance of the component can be secured, and the component can be improved in mechanical strength while it is made thin.

When the upper protective substrate 50a is formed of a thin resin sheet material, and the lower protective substrate 50b is made of dielectric ceramics with low strength although having a high relative permittivity of 200 or more such as barium titanate, a component made thin can be obtained while a large load capacitance of the component is secured.

Furthermore, as shown in FIG. 16, it is also allowed that a protective substrate 50c is further disposed between the lower protective substrate 50b and the insulation plate 40b, the protective substrates 50a and 50c are formed of resin sheet materials, and the protective substrate 50b is made of dielectric ceramic. With this structure, even if the protective substrate 50b made of the above-described dielectric ceramics should crack due to an external force, the airtightness of the vibration space can be maintained by the resin sheet 50c, and a flux can be prevented from intruding at solder-mounting.

Figure 17:
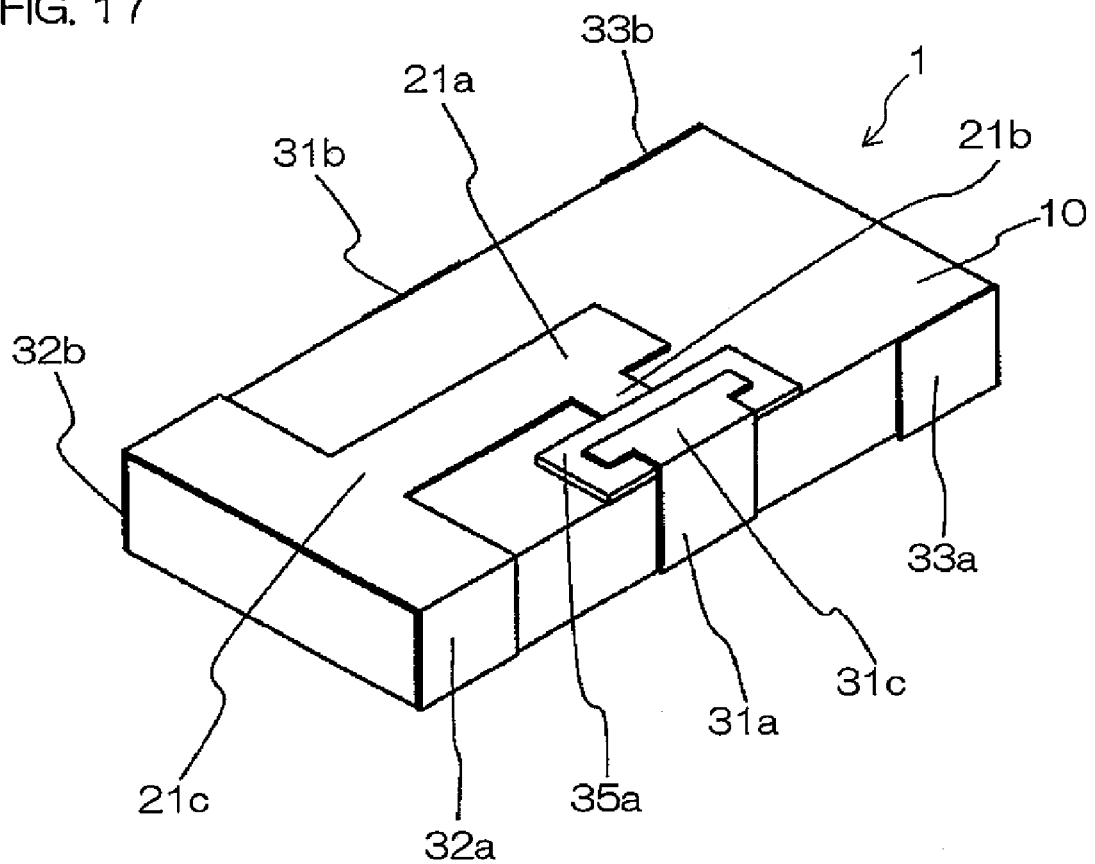
FIG. 17 is an external perspective view showing a piezoelectric oscillation element according to another embodiment of the present invention.
Figure 18:
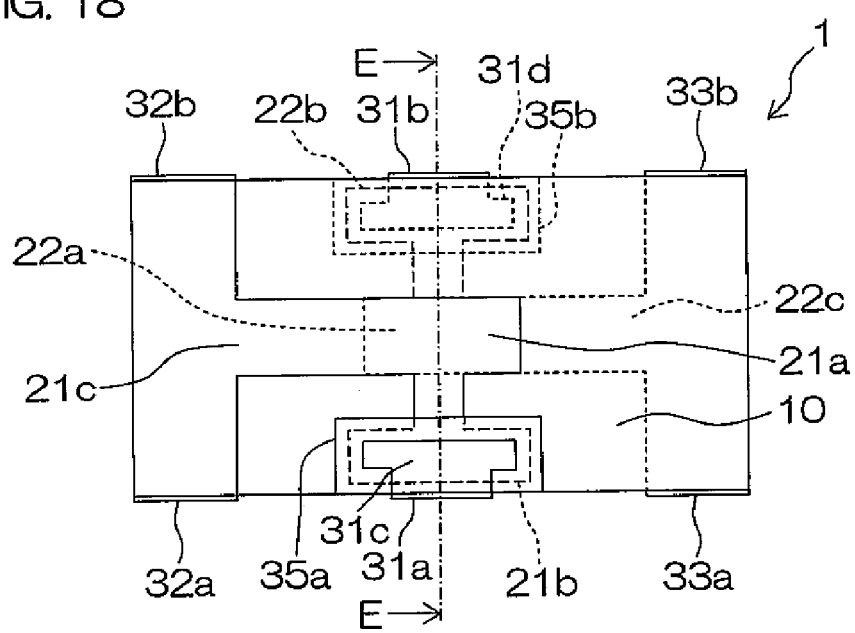
FIG. 18 is a plan view of the same.
Figure 19:
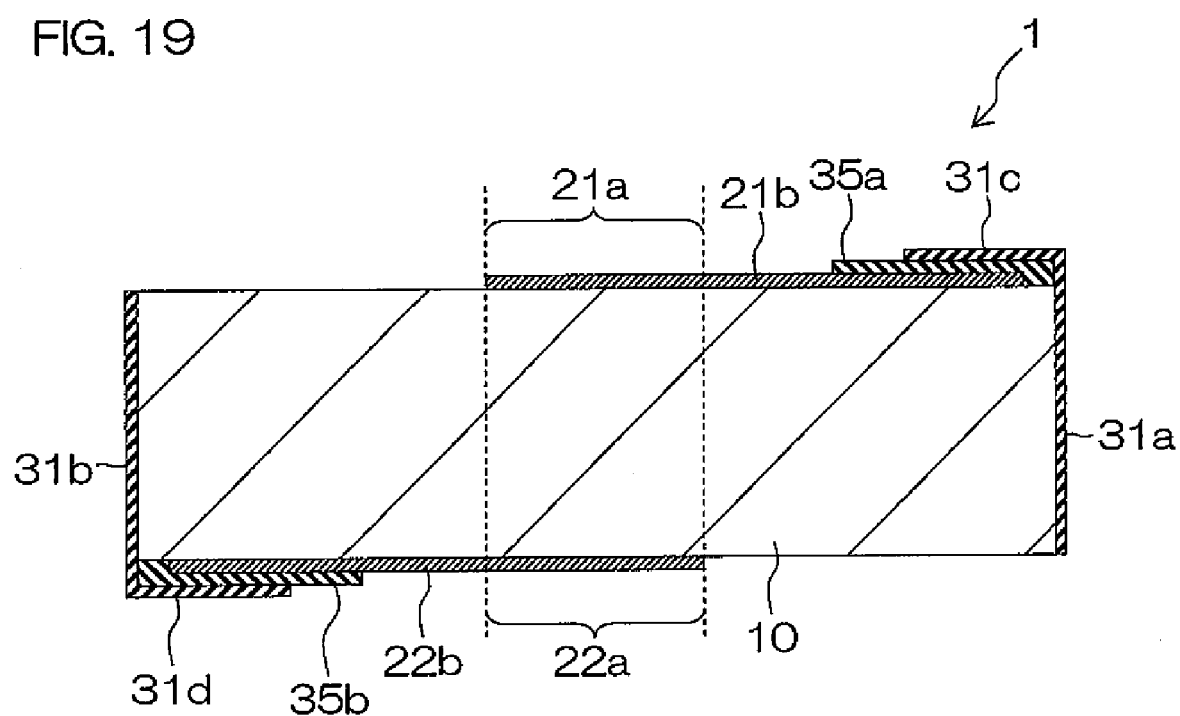
FIG. 19 is a sectional view along E-E of the same.

FIG. 17 is an external perspective view showing a piezoelectric oscillation element of another embodiment of the present invention, FIG. 18 is a plan view observed from above, and FIG. 19 is a sectional view along E-E.

This piezoelectric oscillation element is basically the same in structure as the piezoelectric oscillation elements described with reference to FIG. 1 through FIG. 3, except for the following points.

In this piezoelectric oscillation element 1, a first dielectric layer 35a covering a part of the first capacitance electrode 21b and a second dielectric layer 35b covering a part of the second capacitance electrode 22b are deposited on both main surfaces of the piezoelectric substrate.

In order to prevent attenuation of desired thickness vibration, it is desirable that these dielectric layers 35a and 35b are provided away from the region in which the first vibration electrode 21a and the second vibration electrode 22a face each other and a vibration region near the region.

As the dielectric material forming the dielectric layers 35a and 35b, a polymer-based dielectric material is preferably used since it can be formed according to an easy method such as screen printing. For example, by means of using a polymer-dispersed type dielectric material obtained by mixing inorganic particles (average particle size: 0.5 to 5 μm) of a dielectric material having a high relative permittivity (not less than 1500) such as barium titanate with a resin such as epoxy-based resin or melamine-based resin and dispersing them, or a polymer-composite type dielectric material obtained by chemically decorating the surfaces of inorganic particles (average particle size: 30 to 200 nm (nanometers)) formed by reducing the particle size of a dielectric material with a high relative permittivity (not less than 1500) such as barium titanate and evenly filling these at high concentration in a resin such as an epoxy-based resin, a high relative permittivity can be realized. In terms of the high relative permittivity, a glass-baked type dielectric material obtained by dispersing inorganic particles (average particle diameter: 0.2 to 5 μm) of a dielectric material with a high relative permittivity (not less than 1500) such as barium titanate in a glass base material is also usable. Furthermore, a dielectric film of barium titanate, etc. may be formed by sputtering, aerosol deposition, or molecular collision.

In case of using the polymer-based dielectric material, if the thicknesses of the first dielectric layer 35a and the second dielectric layer 35b are excessively made thin the voltage resistance thereof deteriorates, and if these are excessively made thick, the capacitance value thereof lowers. Desirably, the film thickness when using the polymer-dispersed type dielectric as the dielectric material is in a range of 8 to 20 μm, and the film thickness when using the polymer-composite type dielectric is in a range of 4 to 50 μm. When the glass-baked type dielectric material is used as the dielectric material, for the same reason as described above, it is desirable that the film thickness is in a range of 8 to 20 μm. Furthermore, when a ceramic film is used as the dielectric material, if the film is thin, the voltage resistance deteriorates, and if the film is thick, it takes time to form the film and the cost increases, so that the film thickness is desirably in a range of 1 to 5 μm.

The ground terminal 31a deposited near the center of one side surface of the piezoelectric substrate 10 extends on one main surface of the piezoelectric substrate 10 and forms a first ground electrode 31c. This first ground electrode 31c faces the first capacitance electrode 21b via the first dielectric layer 35a. Thereby, a predetermined capacitance is formed between the same and the first capacitance electrode 21b.

The ground terminal 31b deposited near the center of the other side surface of the piezoelectric substrate 10 extends on the other main surface of the piezoelectric substrate 10 and forms a second ground electrode 31d. This second ground electrode 31d faces the second capacitance electrode 22b via the second dielectric layer 35b. Thereby, between the same and the second capacitance electrode 22b, a predetermined capacitance is formed.

The ground terminal 31a and the first ground electrode 31c are electrically connected, and the ground terminal 31b and the second ground electrode 31d are electrically connected.

In terms of conductivity, it is preferable that the ground terminal 31a, the ground terminal 31b, the first ground electrode 31c, and the second ground electrode 31d are formed of metal films of gold, silver, copper, aluminum, etc., and that thicknesses are in a range of 0.1 to 3 μm. If the metal film is thinner than 0.1 μm, for example, when it is exposed to a high temperature in the atmosphere, its conductivity deteriorates due to oxidation, and if the metal film is thicker than 3 μm, it becomes easy to peel off. Vacuum deposition or sputtering can be used for deposition of the metal film.

The ground terminal 31a, the ground terminal 31b, the first ground electrode 31c, and the second ground electrode 31d may be formed by using a conductive resin such as an epoxy-based resin for the reason that it can be easily formed by a simple device for screen printing. In particular, when a polymer-based material is used for the first dielectric layer 35a and the second dielectric layer 35b, a conductive resin such as an epoxy-based resin is preferably used because of its excellent adhesive strength to the dielectric layer.

As the conductive resin, a thermosetting or light-curable conductive resin is usable, and desirably, it contains at least one kind of metal filler using Ag, Cu, Ni, etc., and the amount of the metal filler in the conductive resin is desirably 75 to 95 weight %. In particular, when a conductive resin is formed to be thin, the smaller particle diameters of the metal filler are preferable, and a conductive resin film with a thickness of 5 to 15 μm can be formed by using a metal filler with an average particle size of 0.5 to 2 μm and by using screen printing, roller transfer, etc.

When ceramic films are used as the first dielectric layer 35a and the second dielectric layer 35b, either of a metal film or a conductive resin may be used as an electrode material.

In the piezoelectric oscillation element 1 of this embodiment, the first and second dielectric layers 35a and 35b are formed to be thin by using a dielectric material with high permittivity, whereby a large capacitance can be easily formed between the first capacitance electrode 21b and the first ground electrode 31c and between the second capacitance electrode 22b and the second ground electrode 31d.

Most of the electric field generated between the first capacitance electrode 21b and the first ground electrode 31c exists in the first dielectric layer 35a, and most of the electric field generated between the second capacitance electrode 22b and the second ground electrode 31d exists in the second dielectric layer 35b, so that the electric fields hardly leak into the piezoelectric substrate 10.

Therefore, suppression of desired vibration and resulting deterioration in oscillation due to electric fields leaking into a vibration region in which the first and second vibration electrodes 21a and 21b face each other via the piezoelectric substrate 10 can be effectively prevented. In addition, deterioration in stability of the oscillation due to undesired vibration generated by the electric fields leaking into other regions of the piezoelectric substrate 10 can be effectively prevented.

Next, piezoelectric oscillation elements of other embodiments of the present invention are shown in FIG. 20 through FIG. 26.

Figure 20:
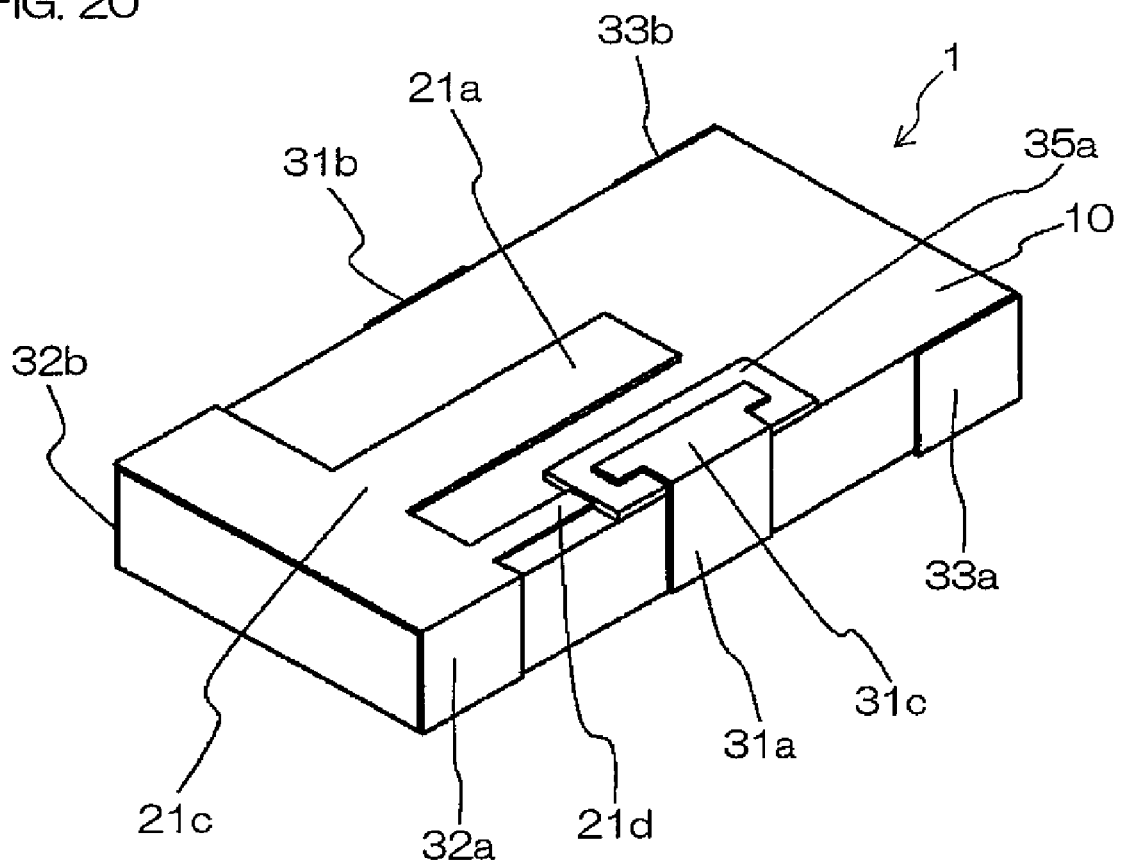
FIG. 20 is an external perspective view showing a piezoelectric oscillation element according to a second embodiment of the present invention.
Figure 21:
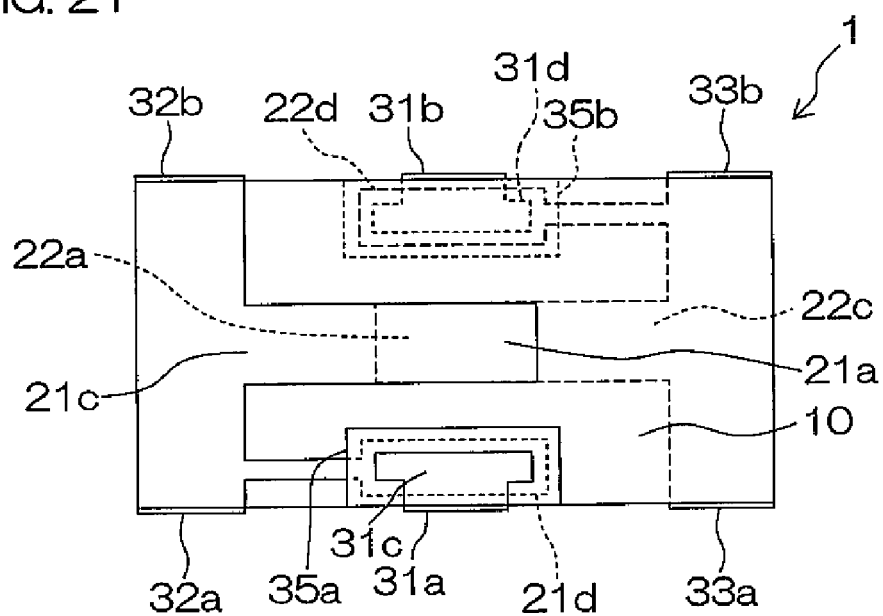
FIG. 21 is a plan view of the same.

FIG. 20 is an external perspective view showing a piezoelectric oscillation element according to another embodiment, and FIG. 21 is a plan view observed from above.

The characteristic portions of the piezoelectric oscillation element 1 of this embodiment are a first capacitance electrode 21d formed so as to extend from the connection electrode 21c toward the ground terminal 31c on one main surface of the piezoelectric substrate 10, and a second capacitance electrode 22d formed so as to extend from the connection electrode 22c toward the ground terminal 31b on the other main surface of the piezoelectric substrate 10.

These capacitance electrodes 21d and 22d face the ground electrode 31c and the ground electrode 31d via the first dielectric layer 35a and the second dielectric layer 35b.

With this structure, as in the case of the embodiment of FIG. 17 through FIG. 19, it becomes unnecessary to form an extra electrode pattern near the vibration region, and a failure that harmfully influences the desired thickness vibration due to mass effect of the electrode and the like can be effectively prevented.

Figure 22:
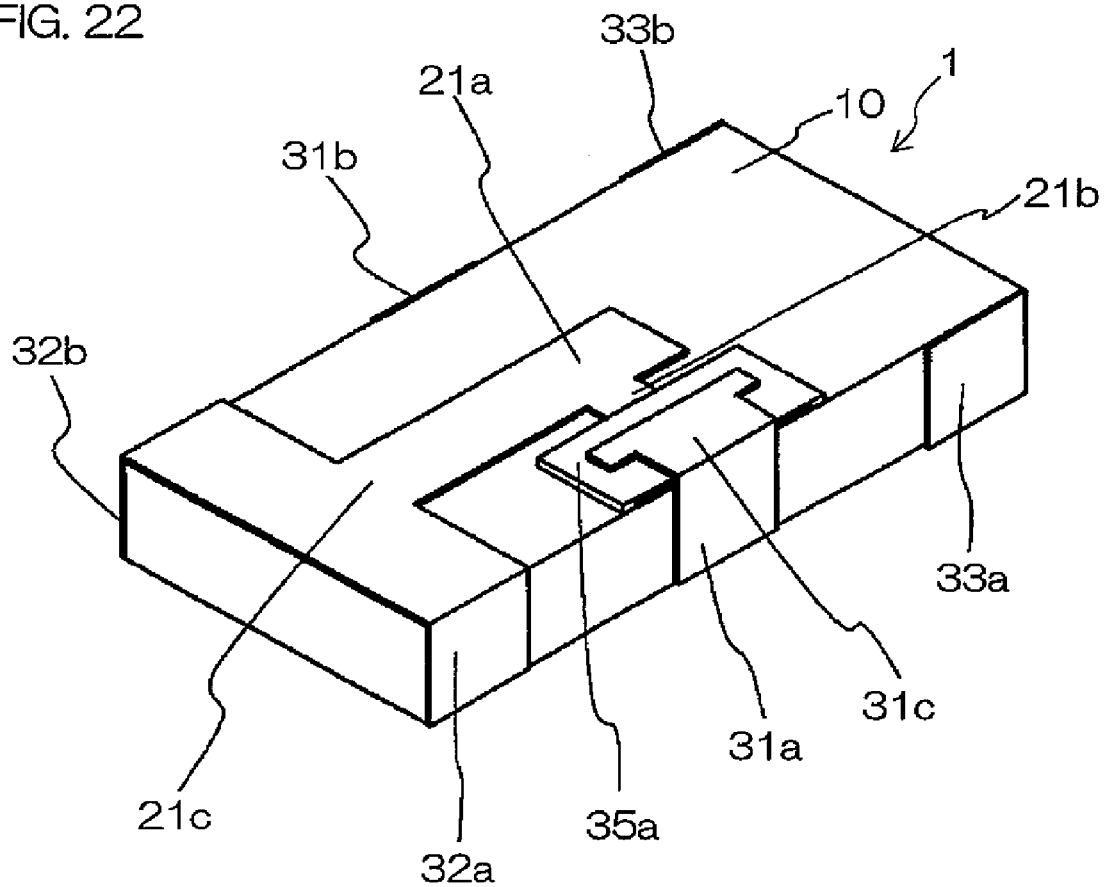
FIG. 22 is an external perspective view showing a piezoelectric oscillation element according to another embodiment of the present invention.
Figure 23:
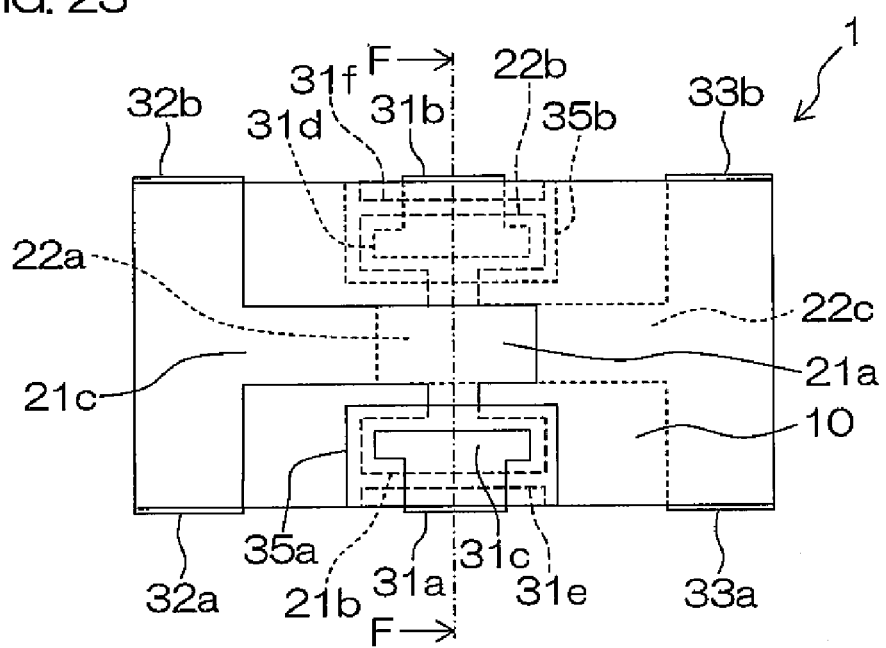
FIG. 23 is a plan view of the same.
Figure 24:
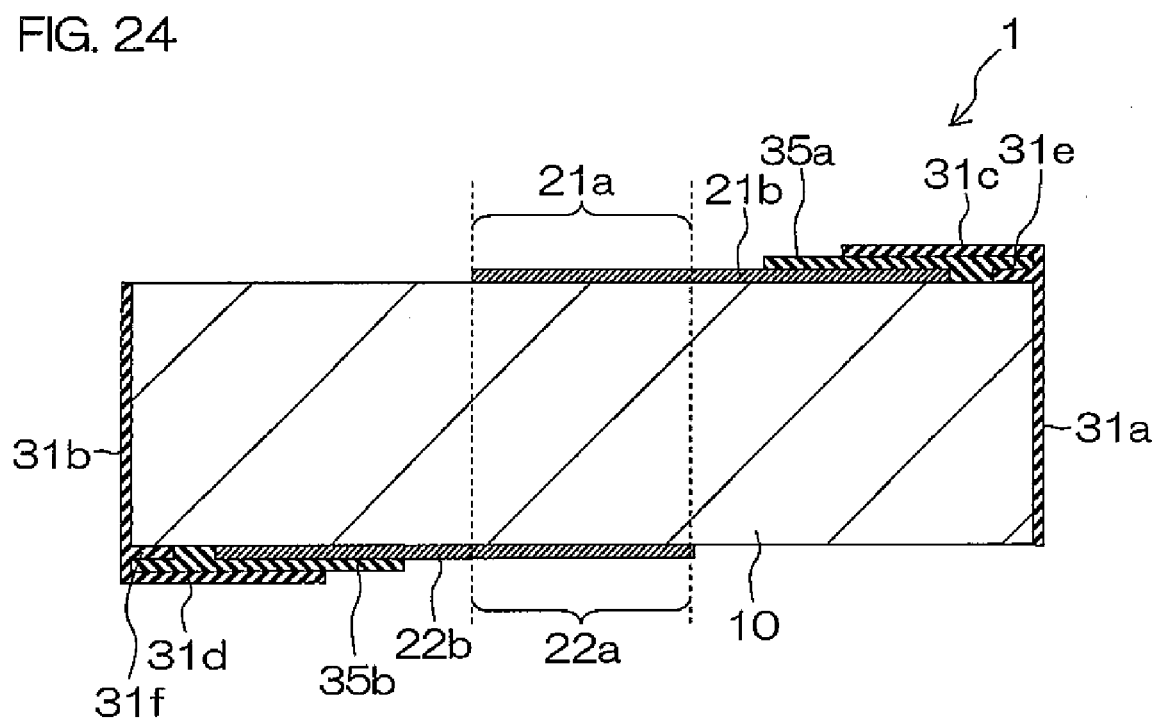
FIG. 24 is a sectional view along F-F of the same.

FIG. 22 is an external perspective view showing a piezoelectric oscillation element according to another embodiment, FIG. 23 is a plan view observed from above, and FIG. 24 is a sectional view along F-F.

The characteristic portions of the piezoelectric oscillation element 1 of this embodiment are a first auxiliary ground electrode 31e to be connected to the ground terminal 31a, formed between the first capacitance electrode 21b on one main surface of the piezoelectric substrate 10 and the side end of the piezoelectric substrate 10, and a second auxiliary ground electrode 31f to be connected to the second ground terminal 31b, formed between the second capacitance electrode 22b on the other main surface of the piezoelectric substrate 10 and the side end of the piezoelectric substrate 10.

Thereby, as shown in FIG. 24, a capacitance is also formed between the first capacitance electrode 21b and the first auxiliary ground electrode 31e and between the second capacitance electrode 22b and the second auxiliary ground electrode 31f, and it becomes possible to more efficiently form load capacitances forming an oscillation circuit.

Figure 25:
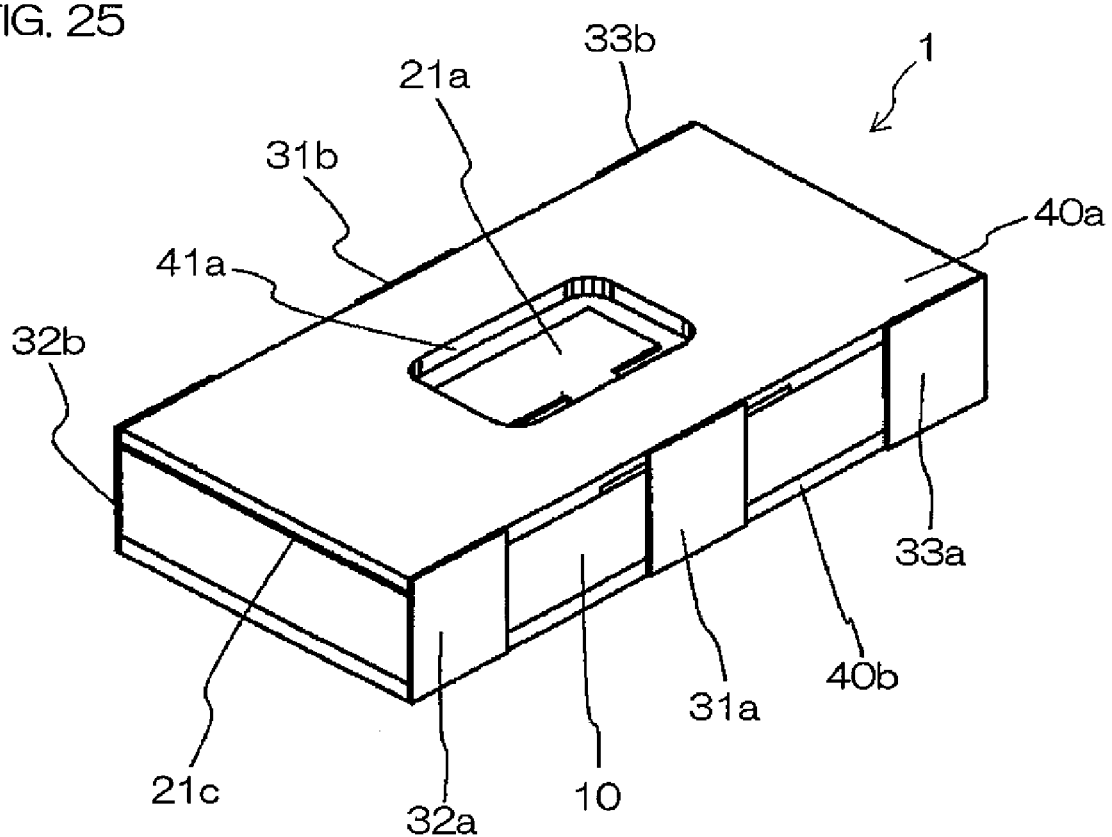
FIG. 25 is an external perspective view showing a piezoelectric oscillation element according to another embodiment of the present invention.
Figure 26:
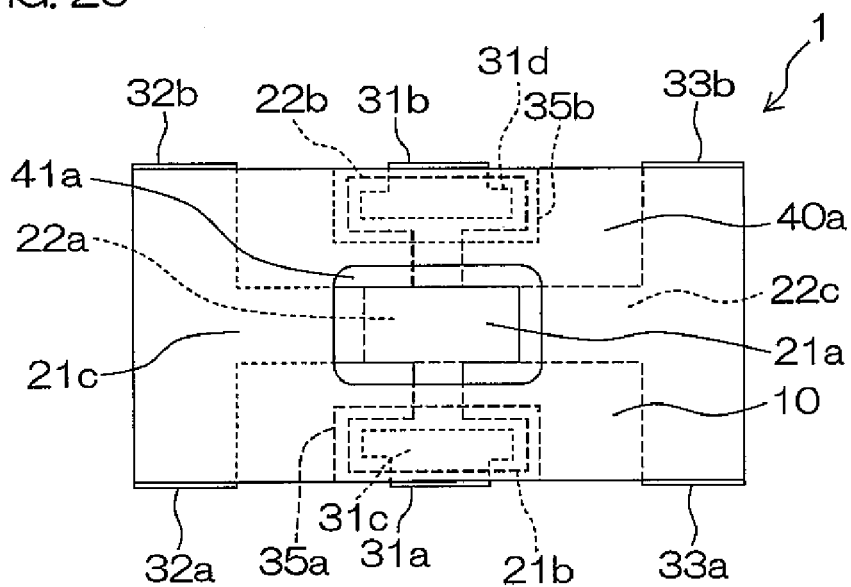
FIG. 26 is a plan view of the same.

FIG. 25 is an external perspective view showing a piezoelectric oscillation element of still another embodiment, and FIG. 26 is a plan view observed from above.

The characteristic portions of the piezoelectric oscillation element 1 of this embodiment are an insulation plate 40a deposited so as to cover the upper portion of the piezoelectric oscillation element 1 shown in FIG. 17 through FIG. 19, and an insulation plate 40b deposited so as to cover the lower portion of this piezoelectric oscillation element 1.

The insulation plates 40a and 40b are thus deposited so as to cover the first and second ground electrodes 31c and 31d, so that the ground electrodes 31c and 31d can be protected from conductive foreign bodies and moisture. Therefore, between the first and second capacitance electrodes 21b and 22b and the ground electrodes 31c and 31d, electrical short circuits due to adhesion of conductive foreign bodies or ion migration can be effectively prevented.

The material of the insulation plates 40a and 40b is the same as described above with reference to FIG. 13 through FIG. 16.

In the piezoelectric oscillation element 1 of this embodiment, the insulation plates 40a and 40b are formed annularly so as to surround the vibration regions. That is, the insulation plate 40a has an opening 41a, and the insulation plate 40b has an opening 41b. Accordingly, due to the openings 41a and 41b, vibration spaces are secured, and it becomes possible to easily mount the piezoelectric oscillation element 1 inside an airtight package, etc.

In addition, the insulation plates 40a and 40b performs two functions of preventing short circuits and securing vibration spaces, so that the piezoelectric oscillation element 1 can be small-sized and reduced in the number of constituting parts.

Figure 27:
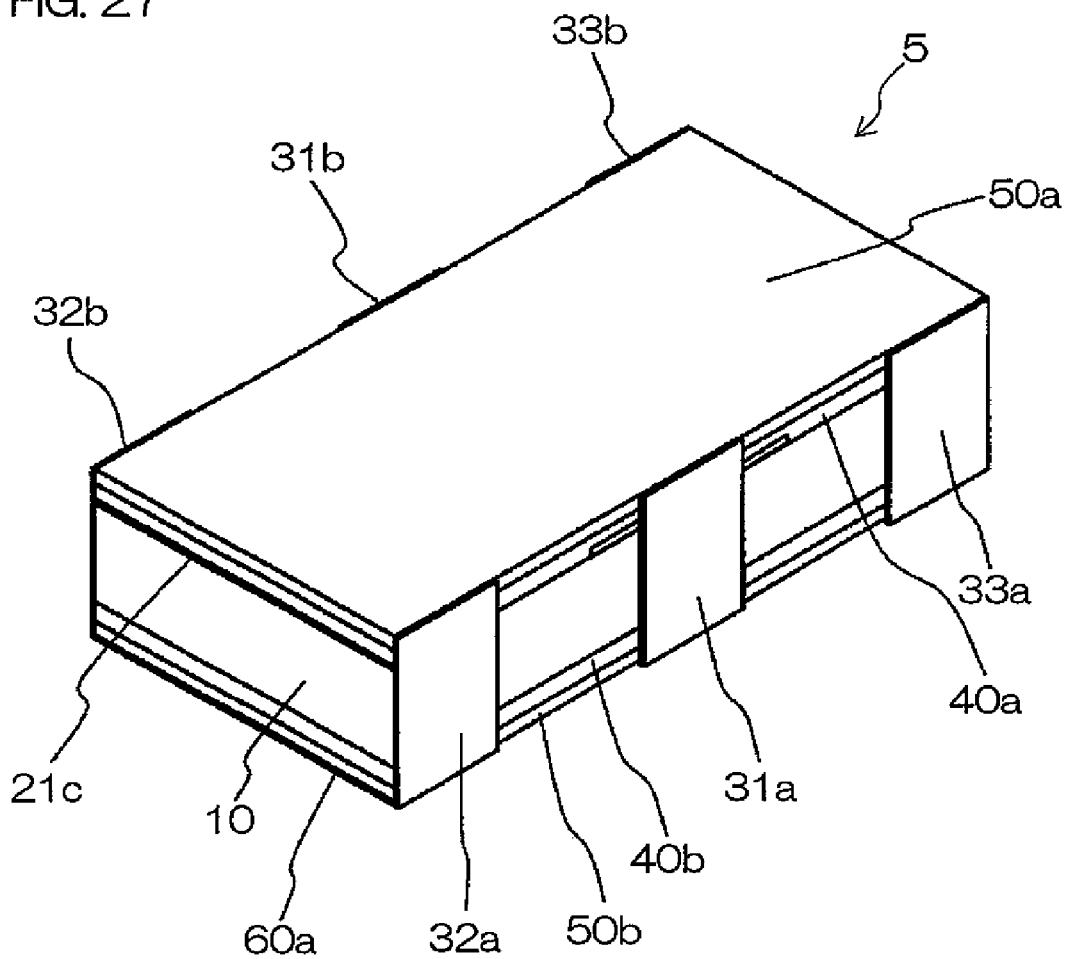
FIG. 27 is an external perspective view showing a piezoelectric oscillation component according to another embodiment of the present invention.
Figure 28:
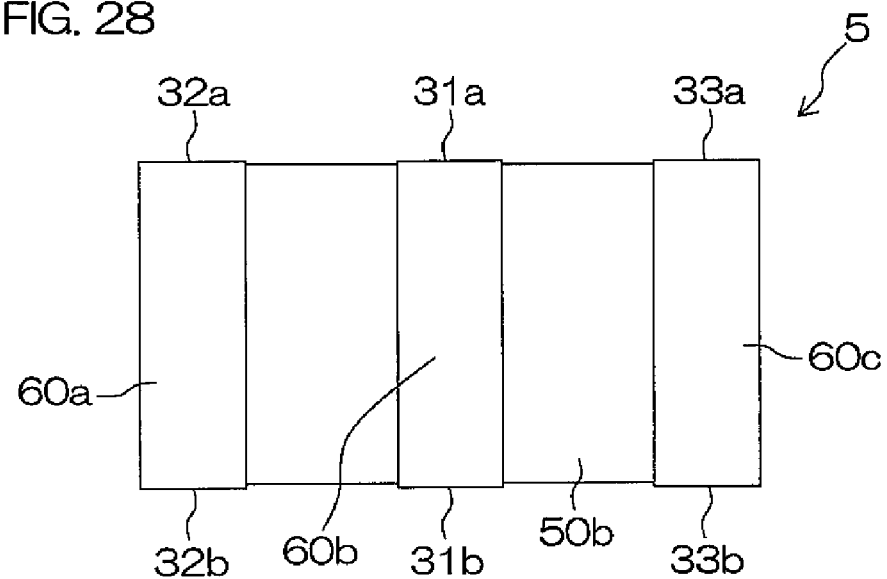
FIG. 28 is a plan view observed from below.
Figure 29:
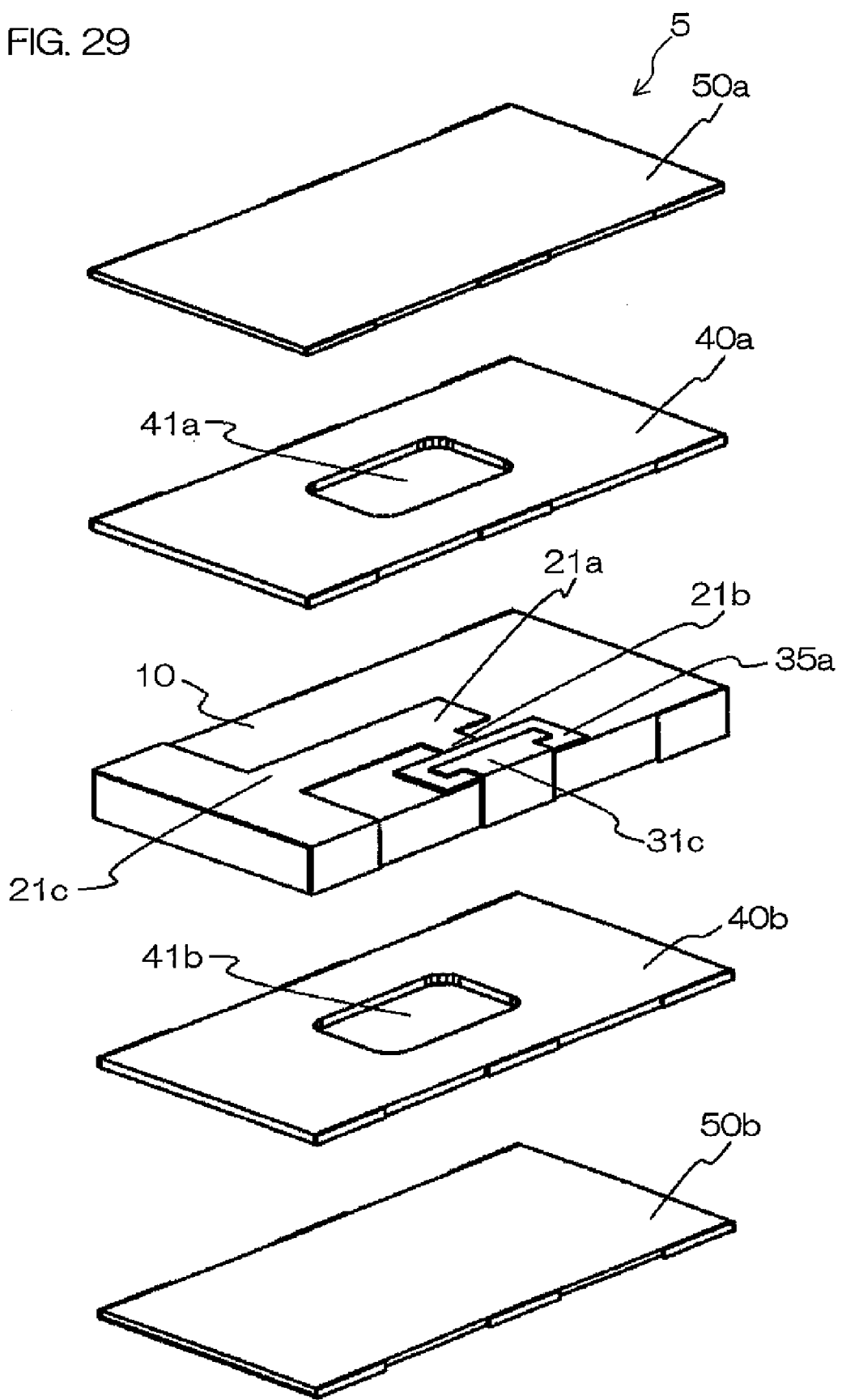
FIG. 29 is an exploded perspective view of the piezoelectric oscillation component.
Figure 30:
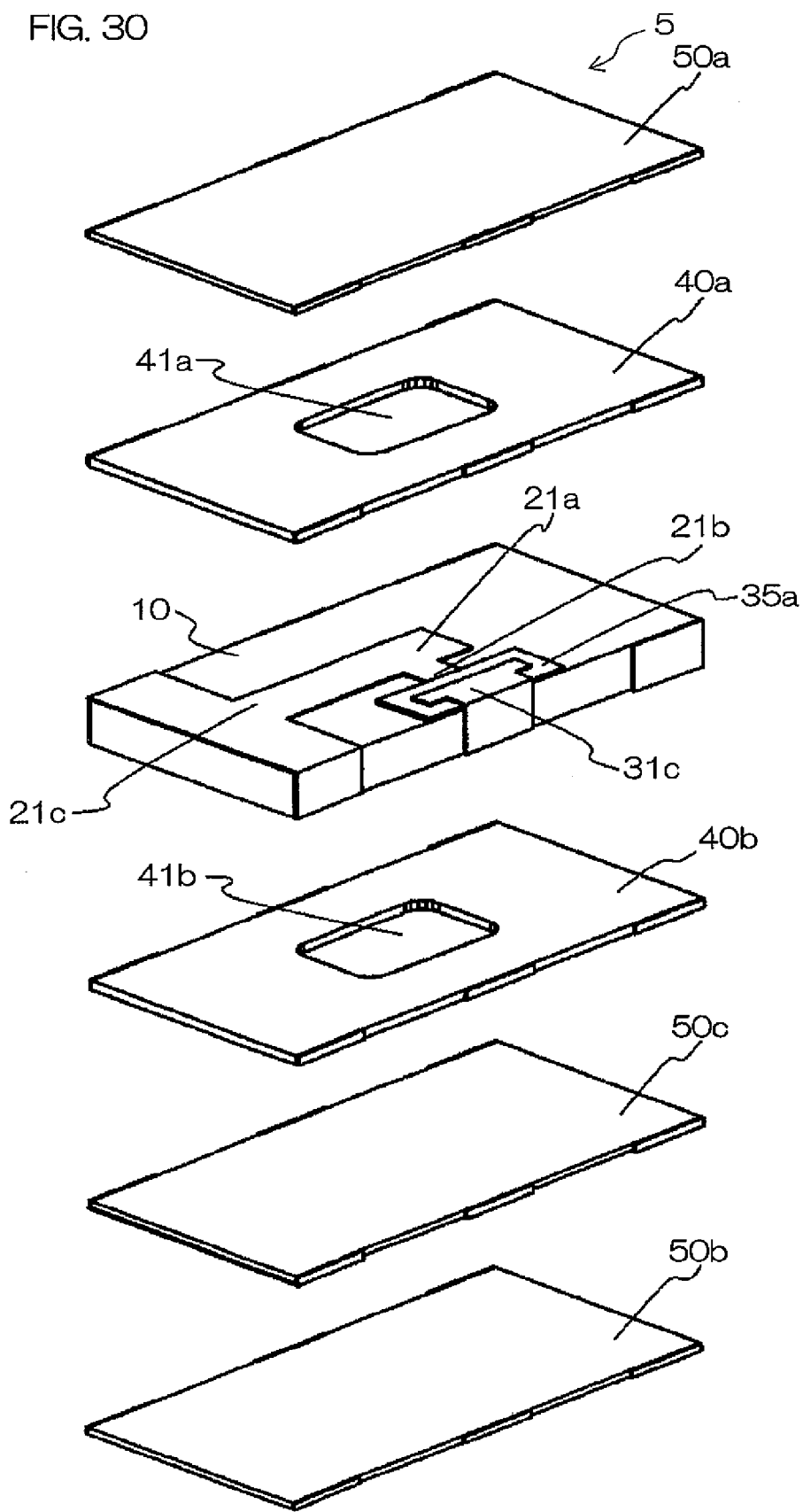
FIG. 30 an exploded perspective view of the piezoelectric oscillation component.

FIG. 27 through FIG. 30 are drawings showing a piezoelectric oscillation component using the piezoelectric oscillation element of the present invention, and FIG. 27 is an external perspective view, FIG. 28 is a plan view observed from below, and FIG. 29 and FIG. 30 are exploded perspective views.

In the piezoelectric oscillation component 5 of this embodiment, protective substrates 50a and 50b are deposited on upper and lower surfaces of the piezoelectric oscillation element 1 shown in FIG. 25 and FIG. 26 via insulation plates 40a and 40b.

Furthermore, on the lower surface of the protective oscillation component 5, external electrodes 60a through 60c are deposited as shown in FIG. 28. The external electrode 60a is connected to the first input/output terminals 32a and 32b, the external electrode 60b is connected to the ground terminals 31a and 31b, and the external electrode 60c is connected to the second input/output terminals 33a and 33b.

Therefore, a capacitance formed between the external electrodes 60a and 60b is added to the capacitance c1 shown in FIG. 4, and a capacitance formed between the external electrodes 60c and 60b is added to the capacitance c2 shown in FIG. 4, so that a larger load capacitance can be formed as a whole.

As the external electrodes 60a through 60c, a conductive resin is preferably used. However, when the protective substrates 50a and 50b are made of a ceramic material, for example, the external electrodes 60a through 60c may be formed by deposition, sputtering or the like of a favorable conductor film of, for example, Ag, or formed by baking a conductive paste.

In the piezoelectric oscillation component 5 of this embodiment, the protective substrates 50a and 50b are deposited on the both main surfaces of the piezoelectric oscillation element 1 via the annular insulation plates 40 formed so as to surround first and second vibration electrodes 21a and 22a. Therefore, the piezoelectric oscillation element 1 can be hermetically sealed by the protective substrates 50a and 50b while vibration spaces are secured by openings 41a and 41b formed near the centers of the insulation plates 40, so that the piezoelectric oscillation component which can be used independently without separately preparing an airtight package is obtained.

In addition, the insulation plates 40a and 40b also perform the function of preventing electrical short circuits between the first and second capacitance electrodes 21b and 22b and the first and second ground electrodes 31c and 31d, so that a piezoelectric oscillation component which is small in size and excellent in reliability can be obtained.

In the piezoelectric oscillation component 5 of the above-described embodiment, the protective substrates 50a and 50b are made of dielectric ceramic or resin sheet material. However, alternatively, for example, the upper protective substrate 50a is formed of a thin resin sheet material and the lower protective substrate 50b is made of dielectric ceramic having a low relative permittivity of not more than 10 and having high strength such as alumina, whereby the load capacitance of the component is secured and the mechanical strength of the component can be improved while the component is made thin.

Furthermore, the upper protective substrate 50a is made of a thin resin sheet material, and the lower protective substrate 50b is made of low-strength dielectric ceramic while having a high relative permittivity of not less than 200 such as barium titanate, whereby the component can be made thin while a large load capacitance can be secured.

Furthermore, it is also allowed that a protective substrate 50c is disposed between the lower protective substrate 50b and the insulation plate 40b as shown in FIG. 30 and the protective substrates 50a and 50c are formed of resin sheet materials and the protective substrate 50b is made of dielectric ceramic. With this structure, even if the protective substrate 50b made of dielectric ceramic should crack due to an external force, airtightness of the vibration space can be maintained by the protective substrate 50c formed of a resin sheet, so that fluxing can be prevented from intruding at solder-mounting.

The present invention is not limited to the above-described embodiments, and can be variously varied and modified without deviating from the spirit of the present invention.

For example, in the piezoelectric oscillation element 1 shown in FIG. 1 through FIG. 3 and FIG. 5 through FIG. 7, the first and second capacitance electrodes 21b and 22b which are constant in width are formed from the first and second vibration electrodes 21a and 22a toward the ground terminals 31a and 31b. However, the present invention is not limited to this form.

Figure 31:
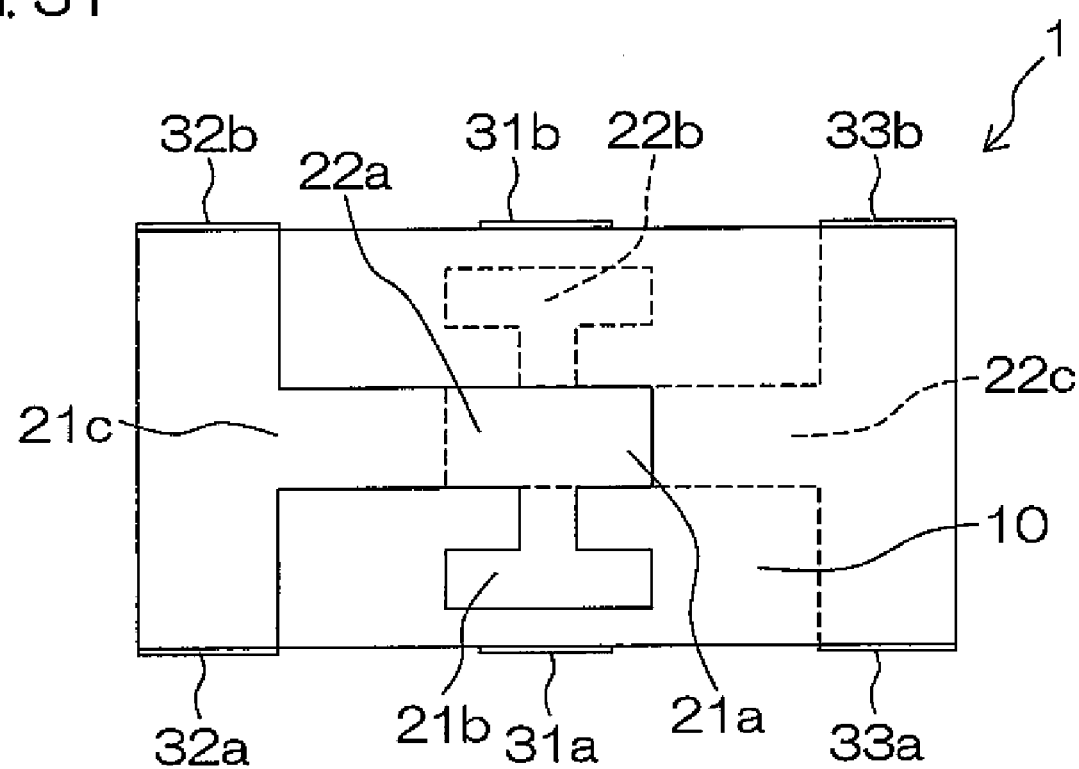
FIG. 31 is a plan view of a piezoelectric oscillation element according to a variation.

As shown in FIG. 31, the first and second capacitance electrodes 21b and 22b may be widened near the ground terminals 31a and 31b. This makes it possible to form a larger capacitance.

In the piezoelectric oscillation element 1 shown in FIG. 17 through FIG. 26, the first dielectric 35a and the first ground electrode 31c are each laminated as one layer on the first capacitance electrode 21b, and the second dielectric 35b and the second ground electrode 31d are each laminated as one layer on the second capacitance electrode 22b.

However, without limiting to this, a plurality of layers may be laminated alternately, such as a dielectric layer, a ground electrode, a capacitance electrode, a dielectric layer, a ground electrode, and so on in order, on the first and second capacitance electrodes. This makes it possible to easily form a larger capacitance.

The piezoelectricoscillation element 1 shown in FIG. 17 through FIG. 26 shows an example in which no electrode is formed on portions that face the connection electrodes 21c and 22c via the piezoelectric substrate 10. However, on these portions, electrodes with the same potential as that of the connection electrode 21c or 22c may be formed.

The material of the insulation plates 40a and 40b of the piezoelectric oscillation component 5 is not limited to a resin material, and they may be made of a glass-based material to a thickness of 5 to 80 μm, or may be made of an oxide film of $Al_2O_3$ or $SiO_2$ to a thickness of 0.1 to 10 μm. On these insulators, insulators made of a resin material may be formed so as to surround the first and second vibration electrodes 21a and 22a.

What is claimed is:

1. A piezoelectric oscillation element comprising:
   a piezoelectric substrate;
   a first conductor film formed on one main surface of the piezoelectric substrate;
   a second conductor film formed on the other main surface of the piezoelectric substrate;
   ground terminals formed on both side surfaces of the piezoelectric substrate; and
   first and second input/output terminals formed on side surfaces of the piezoelectric substrate at positions where the ground terminals are arranged between the first and second input/output terminals, wherein
   the first conductor film has a first connection electrode to be connected to the first input/output terminal, a first vibration electrode leading to the first connection electrode, and a first capacitance electrode extended from the first connection electrode or the first vibration electrode toward one of the ground terminals wherein
   the second conductor film has a second connection electrode to be connected to the second input/output terminal, a second vibration electrode leading to the second connection electrode, and a second capacitance electrode extended from the second connection electrode or the second vibration electrode toward the other ground electrode,
   predetermined capacitances are formed between the first and second capacitance electrodes and the ground terminals, respectively, and
   the first and second vibration electrodes face each other by sandwiching the piezoelectric substrate therebetween.

2. The piezoelectric oscillation element according to claim 1, wherein no electrode is formed in a region facing the first capacitance electrode via the piezoelectric substrate, and no electrode is formed in a region facing the second capacitance electrode via the piezoelectric substrate.

3. The piezoelectric oscillation element according to claim 1, wherein insulators are deposited on the piezoelectric substrate at positions between the first and second capacitance electrodes and the ground terminals.

4. The piezoelectric oscillation element according to claim 1, wherein in a region facing the first capacitance electrode via the piezoelectric substrate, a first auxiliary capacitance electrode having a potential that is not different from that of the first capacitance electrode is formed, and
   in a region facing the second capacitance electrode via the piezoelectric substrate, a second auxiliary capacitance electrode having a potential that is not different from that of the second capacitance electrode is formed.

5. The piezoelectric oscillation element according to claim 4, wherein
   insulators are deposited on the piezoelectric substrate at positions between the first and second capacitance electrodes and the ground terminals, and
   insulators are deposited on the piezoelectric substrate at positions between the first and second auxiliary capacitance electrodes and the ground terminals.

6. The piezoelectric oscillation element according to claim 1, wherein the ground terminals are made of an elastic material having conductivity.

7. The piezoelectric oscillation element according to claim 1, further comprising: a first dielectric layer covering a part of the first capacitance electrode; and
   a second dielectric layer covering a part of the second capacitance electrode, wherein
   the ground terminals are connected to a first ground electrode that faces the first capacitance electrode via the first dielectric layer and a second ground electrode that faces the second capacitance electrode via the second dielectric layer.

8. The piezoelectric oscillation element according to claim 7, wherein
   a first auxiliary ground electrode to be connected to the ground terminal is formed between the first capacitance electrode on one main surface of the piezoelectric substrate and a side end of the piezoelectric substrate, and
   a second auxiliary ground electrode to be connected to the ground terminal is formed between the second capacitance electrode on the other main surface of the piezoelectric substrate and the side end of the piezoelectric substrate.

9. The piezoelectric oscillation element according to claim 7, wherein insulation plates are deposited so as to cover the first ground electrode and the second ground electrode.

10. The piezoelectric oscillation element according to claim 9, wherein
    the insulation plates are formed annularly so as to surround the first and second vibration electrodes.

11. A piezoelectric oscillation component formed by providing protective substrates on and under the piezoelectric oscillation element according to claim 1.

12. The piezoelectric oscillation component according to claim 11, wherein upper and lower surfaces of the piezoelectric oscillation element are sandwiched by insulation plates having openings formed so as to surround the first and second vibration electrodes, and the protective substrates are deposited on the upper and lower surfaces of the piezoelectric oscillation element via the insulation plates.

* * * * *